US012666941B2

(12) United States Patent
Hardiman et al.

(10) Patent No.: US 12,666,941 B2
(45) Date of Patent: Jun. 23, 2026

(54) INTERCONNECT METAL OPENINGS THROUGH DIELECTRIC FILMS

(71) Applicant: Cree, Inc., Durham, NC (US)

(72) Inventors: Christopher Hardiman, Morrisville, NC (US); Daniel Namishia, Wake Forest, NC (US); Kyle Bothe, Cary, NC (US); Elizabeth Keenan, Cary, NC (US); David Santa Ana, Durham, NC (US); Daniel Etter, Durham, NC (US)

(73) Assignee: Wolfspeed, Inc., Durham, NC (US)

( * ) Notice: Subject to any disclaimer, the term of this patent is extended or adjusted under 35 U.S.C. 154(b) by 258 days.

(21) Appl. No.: 17/390,316

(22) Filed: Jul. 30, 2021

(65) Prior Publication Data

US 2023/0029763 A1 Feb. 2, 2023

(51) Int. Cl.
H10W 20/42 (2026.01)
H10W 20/00 (2026.01)
H10W 74/10 (2026.01)

(52) U.S. Cl.
CPC ......... H10W 20/42 (2026.01); H10W 20/082 (2026.01); H10W 74/147 (2026.01)

(58) Field of Classification Search
CPC .......... H01L 23/5226; H01L 21/76804; H01L 23/3192; H10W 20/42; H10W 20/082; H10W 74/147
See application file for complete search history.

(56) References Cited

U.S. PATENT DOCUMENTS

| | | | | |
|---|---|---|---|---|
| 4,145,703 A | * | 3/1979 | Blanchard ......... | H01L 29/41741 257/331 |
| 6,246,076 B1 | | 6/2001 | Lipkin et al. | |
| 7,525,122 B2 | | 4/2009 | Ring et al. | |
| 10,355,017 B1 | * | 7/2019 | Nakatsuji ............... | H10B 43/50 |
| 10,971,579 B2 | * | 4/2021 | Wong .................. | H01L 29/7787 |
| 2010/0238331 A1 | * | 9/2010 | Umebayashi .......... | H04N 25/79 257/E31.097 |
| 2012/0267740 A1 | * | 10/2012 | Okamoto .......... | H01L 21/76898 257/432 |
| 2013/0341802 A1 | * | 12/2013 | Su ........................... | H01L 24/05 257/E21.578 |
| 2015/0279925 A1 | * | 10/2015 | Breil .................... | H10B 12/036 438/387 |
| 2016/0093582 A1 | * | 3/2016 | Wang ...................... | H01L 24/96 257/773 |
| 2017/0222032 A1 | * | 8/2017 | Liu ..................... | H01L 29/4966 |
| 2020/0035612 A1 | * | 1/2020 | Ho .................... | H01L 23/53295 |

(Continued)

*Primary Examiner* — Norman D Richards
*Assistant Examiner* — Sean Ayers Winters
(74) *Attorney, Agent, or Firm* — Myers Bigel, P.A.

(57) ABSTRACT

A semiconductor die includes a semiconductor body having a gate, a source contact, and a drain contact thereon, a metal contact structure on the semiconductor body and electrically connected to the gate, the source contact, or the drain contact, and an encapsulation structure. The encapsulation structure includes first and second encapsulation layers of respective non-conductive materials stacked on the metal contact structure, and an opening extending therethrough to expose the metal contact structure. The opening includes a sidewall having a substantially continuous slope that extends through the first and second encapsulation layers to the metal contact structure. Related devices and fabrication methods are also discussed.

32 Claims, 10 Drawing Sheets

(56) References Cited

U.S. PATENT DOCUMENTS

| | | | | |
|---|---|---|---|---|
| 2020/0035779 A1* | 1/2020 | Huang | ................ | H01L 23/5223 |
| 2020/0083249 A1* | 3/2020 | Matsuura | ............... | H10B 43/27 |
| 2020/0135871 A1* | 4/2020 | Tsai | .................... | H01L 29/401 |
| 2020/0395242 A1* | 12/2020 | Shih | ................. | H01L 21/76805 |

* cited by examiner

INTERCONNECT METAL OPENINGS THROUGH DIELECTRIC FILMS

FIELD

The present invention relates to semiconductor devices, and more particularly, to environmental protection of semiconductor devices and related fabrication methods.

BACKGROUND

Materials such as silicon (Si) and gallium arsenide (GaAs) have found wide application in semiconductor devices for low power and, in the case of Si, low frequency applications. However, these materials may not be well-suited for high power and/or high frequency applications, for example, due to their relatively small bandgaps (1.12 eV for Si and 1.42 for GaAs at room temperature) and relatively small breakdown voltages.

For high power, high temperature and/or high frequency applications and devices, wide bandgap semiconductor materials may be used, such as silicon carbide (SiC) (e.g., with a bandgap of about 3.2 eV for 4H—SiC at room temperature) and the Group III nitrides (e.g., with a bandgap of about 3.36 eV for gallium nitride (GaN) at room temperature). As used herein, the term "Group III nitride" refers to those semiconducting compounds formed between nitrogen and the elements in Group III of the periodic table, usually aluminum (Al), gallium (Ga), and/or indium (In). The term also refers to ternary and quaternary compounds, such as AlGaN and AlInGaN. These compounds have empirical, formulas in which one mole of nitrogen is combined with a total of one mole of the Group III elements. These materials may have higher electric field breakdown strengths and higher electron saturation velocities as compared to GaAs and Si.

Semiconductor devices fabricated from SiC and/or Group III nitrides may include power transistor devices, such as field effect transistor (FET) devices including MOSFETs (metal-oxide semiconductor field-effect transistors), DMOS (double-diffused metal-oxide semiconductor) transistors, HEMTs (high electron mobility transistors), MESFETs (metal-semiconductor field-effect transistors), LDMOS (laterally-diffused metal-oxide semiconductor) transistors, etc. These devices are typically passivated with an oxide layer, such as silicon dioxide (SiO$_2$), to protect the exposed surfaces of the device and/or other reasons. The interface between the semiconductor body and the oxide layer, however, may be insufficient to obtain a high surface mobility of electrons. For example, the interface between SiC and SiO$_2$ conventionally exhibits a high density of interface states, which may reduce surface electron mobility and introduce carrier traps, which in turn can reduce the desired performance characteristics of devices.

Accordingly, semiconductor devices, including those that include oxide layers, may also incorporate one or more layers of silicon nitride (SiN) to improve the resulting electronic properties, e.g., as described in U.S. Pat. No. 6,246,076. SiN may also provide an environmental barrier, without which the structure and operation of the device may be susceptible to environmental degradation, regardless of the presence of an oxide layer.

As an environmental barrier, SiN may form a better seal over the device in comparison to SiO$_2$, reducing or preventing contaminants such as water from reaching the epitaxial layers of the device and causing degradation. Plasma Enhanced Chemical Vapor Deposition (PECVD) may be used to form SiN as an environmental barrier for a semiconductor device, e.g., as described in U.S. Pat. No. 7,525,122. However, while a PECVD SiN layer may serve as a suitable environmental barrier in many implementations, a PECVD SiN layer may be prone to defects, such as pin holes and columnar structures. These defects can allow moisture to penetrate the PECVD SiN layer and reach the semiconductor device.

SUMMARY

According to some embodiments of the present invention, a semiconductor die includes a semiconductor body comprising a gate, a source contact, and a drain contact thereon. A metal contact structure is on the semiconductor body and is electrically connected to the gate, the source contact, or the drain contact. An encapsulation structure includes first and second encapsulation layers of respective non-conductive materials stacked on the metal contact structure. An opening extends through the encapsulation structure to expose the metal contact structure. The opening comprises a sidewall that extends through the first and second encapsulation layers to the metal contact structure, where a slope of the sidewall does not vary by more than about 30 degrees.

In some embodiments, the first encapsulation layer is between the second encapsulation layer and the metal contact structure, the sidewall comprises an edge of the second encapsulation layer having a second slope adjacent the opening, and the slope of the sidewall comprises the second slope.

In some embodiments, the metal contact structure comprises a first metal layer and a second metal layer between the first metal layer and the encapsulation structure, and the opening extends through the second metal layer to a surface of the first metal layer.

In some embodiments, the sidewall further comprises an edge of the first encapsulation layer having a first slope adjacent the opening, and the slope of the sidewall further comprises the first slope.

In some embodiments, the sidewall further comprises an edge of the second metal layer having a third slope adjacent the opening that is less than or equal to the first slope, and the slope of the sidewall further comprises the third slope.

In some embodiments, the second slope is greater than or equal to the first slope.

In some embodiments, the first, second, and third slopes are negative slopes, or the first, second, and third slopes are positive slopes.

In some embodiments, the edges of the second metal layer, the first encapsulation layer, and the second encapsulation layer define respective angles of about 35 to 55 degrees relative to a normal to the surface of the first metal layer.

In some embodiments, the first, second, and third slopes do not vary by more than about 10 degrees.

In some embodiments, the edge of the second encapsulation layer laterally extends beyond the edge of the first encapsulation layer.

In some embodiments, the sidewall comprising the edge of the second encapsulation layer extends along the edge of the first encapsulation layer and on an interface between the first encapsulation layer and the second metal layer.

In some embodiments, an edge of the second metal layer adjacent the opening is covered by the second encapsulation layer, and the sidewall comprising the edge of the second encapsulation layer directly contacts the surface of the first metal layer.

In some embodiments, the first encapsulation layer comprises $SiO_2$, SiN, SiON, and/or $Al_2O_3$.

In some embodiments, the second encapsulation layer comprises polyimide, benzocyclobutene (BCB), borosilicate glass (BSG), polyamide, polybenzoxazole (PBO), and/or a photoresist material.

In some embodiments, the sidewall defines an angle of about 40 to 50 degrees relative to a surface of the metal contact structure.

According to some embodiments of the present invention, a semiconductor die includes semiconductor body comprising a gate, a source contact, and a drain contact thereon. A metal contact structure is on the semiconductor body and is electrically connected to the gate, the source contact, or the drain contact. An encapsulation structure includes first and second encapsulation layers of respective non-conductive materials stacked on the metal contact structure, and an opening extending therethrough to expose the metal contact structure. The first encapsulation layer is between the second encapsulation layer and the metal contact structure. An edge of the first encapsulation layer adjacent the opening does not laterally extend beyond an edge of the second encapsulation layer adjacent the opening.

In some embodiments, the opening comprises a sidewall that extends through the first and second encapsulation layers to the metal contact structure, and the sidewall comprises the edge of the second encapsulation layer.

In some embodiments, the metal contact structure comprises a first metal layer and a second metal layer between the first metal layer and the encapsulation structure, and the opening extends through the second metal layer to a surface of the first metal layer.

In some embodiments, the sidewall comprising the edge of the second encapsulation layer extends along the edge of the first encapsulation layer and on an interface between the first encapsulation layer and the second metal layer.

In some embodiments, an edge of the second metal layer adjacent the opening is covered by the second encapsulation layer, and the sidewall comprising the edge of the second encapsulation layer directly contacts the surface of the first metal layer.

In some embodiments, the edge of the first encapsulation layer has a first slope, and an edge of the second metal layer has a third slope that is less than or equal to the first slope.

In some embodiments, the edge of the first encapsulation layer has a first slope, and the edge of the second encapsulation layer has a second slope that is greater than or equal to the first slope.

In some embodiments, the sidewall defines an angle of about 35 to 55 degrees relative to a surface of the metal contact structure.

According to some embodiments of the present invention, a method of fabricating a transistor device includes providing a semiconductor body, forming a metal contact structure on the semiconductor body, forming an encapsulation structure comprising first and second encapsulation layers of respective non-conductive materials stacked on the metal contact structure, and forming an opening extending through the first and second encapsulation layers to expose the metal contact structure. The opening comprises a sidewall that extends through the first and second encapsulation layers to the metal contact structure, and a slope of the sidewall does not vary by more than about 30 degrees.

In some embodiments, the first encapsulation layer is between the second encapsulation layer and the metal contact structure, the sidewall comprises an edge of the second encapsulation layer having a second slope adjacent the opening, and the slope of the sidewall comprises the second slope.

In some embodiments, the metal contact structure comprises a first metal layer and a second metal layer between the first metal layer and the encapsulation structure, and the opening extends through the second metal layer to a surface of the first metal layer.

In some embodiments, the sidewall further comprises an edge of the first encapsulation layer having a first slope adjacent the opening, and the slope of the sidewall further comprises the first slope.

In some embodiments, the sidewall further comprises an edge of the second metal layer having a third slope adjacent the opening that is less than or equal to the first slope, and the slope of the sidewall further comprises the third slope.

In some embodiments, the edges of the second metal layer, the first encapsulation layer, and the second encapsulation layer define respective angles of about 35 to 55 degrees relative to a normal to the surface of the first metal layer.

In some embodiments, the first, second, and third slopes do not vary by more than about 10 degrees.

In some embodiments, forming the opening includes patterning the second encapsulation layer to expose a portion of the first encapsulation layer, performing a first etching operation to remove the portion of the first encapsulation layer and expose a portion of the second metal layer, and performing a second etching operation to remove the portion of the second metal layer and expose the surface of the first metal layer.

In some embodiments, responsive to the first and second etching operations, the second slope is greater than or equal to the first slope.

In some embodiments, at least one of the first or second etching operations comprises a passivation gas and is configured to remove the portion of the first encapsulation layer or the second metal layer, respectively, without substantial lateral etching of the edge of the second encapsulation layer.

In some embodiments, the edge of the second encapsulation layer laterally extends beyond the edge of the first encapsulation layer.

In some embodiments, the sidewall comprising the edge of the second encapsulation layer extends along the edge of the first encapsulation layer and on an interface between the first encapsulation layer and the second metal layer.

In some embodiments, an edge of the second metal layer adjacent the opening is covered by the second encapsulation layer, and the sidewall comprising the edge of the second encapsulation layer directly contacts the surface of the first metal layer.

In some embodiments, forming the opening includes performing a first etching operation to remove a portion of the first encapsulation layer and expose a portion of the second metal layer, performing a second etching operation to remove the portion of the second metal layer and expose the surface of the first metal layer, forming the second encapsulation layer on the first encapsulation layer and on the surface of the first metal layer, and patterning the second encapsulation layer to expose the surface of the first metal layer.

In some embodiments, the second encapsulation layer comprises a photosensitive material, and patterning the second encapsulation layer comprises photolithographically patterning the second encapsulation layer to expose the surface of the first metal layer.

In some embodiments, the sidewall defines an angle of about 40 to 50 degrees relative to a surface of the metal contact structure.

According to some embodiments of the present invention, a semiconductor die, includes a semiconductor body comprising a gate, a source contact, and a drain contact thereon. A metal contact structure is on the semiconductor body and is electrically connected to the gate, the source contact, or the drain contact. An encapsulation structure includes first and second encapsulation layers of respective non-conductive materials stacked on the metal contact structure, and an opening extending therethrough to expose the metal contact structure. The opening includes a sidewall having a substantially continuous slope that extends through the first and second encapsulation layers to the metal contact structure.

In some embodiments, the first encapsulation layer is between the second encapsulation layer and the metal contact structure, the sidewall comprises an edge of the second encapsulation layer having a second slope adjacent the opening, and the substantially continuous slope comprises the second slope.

In some embodiments, the metal contact structure comprises a first metal layer and a second metal layer between the first metal layer and the encapsulation structure, and the opening extends through the second metal layer to a surface of the first metal layer.

In some embodiments, the sidewall further comprises an edge of the first encapsulation layer having a first slope adjacent the opening, and the substantially continuous slope further comprises the first slope.

In some embodiments, the sidewall further comprises an edge of the second metal layer having a third slope adjacent the opening that is less than or equal to the first slope, and the substantially continuous slope further comprises the third slope.

In some embodiments, the second slope is greater than or equal to the first slope.

In some embodiments, the first, second, and third slopes are negative slopes or the first, second, and third slopes are positive slopes.

In some embodiments, the edges of the second metal layer, the first encapsulation layer, and the second encapsulation layer define respective angles of about 35 to 55 degrees relative to a normal to the surface of the first metal layer.

In some embodiments, the edge of the second encapsulation layer laterally extends beyond the edge of the first encapsulation layer.

In some embodiments, the sidewall comprising the edge of the second encapsulation layer extends along the edge of the first encapsulation layer and on an interface between the first encapsulation layer and the second metal layer.

In some embodiments, an edge of the second metal layer adjacent the opening is covered by the second encapsulation layer, and the sidewall comprising the edge of the second encapsulation layer directly contacts the surface of the first metal layer.

In some embodiments, the substantially continuous slope does not vary by more than about 30 degrees.

Other devices, apparatus, and/or methods according to some embodiments will become apparent to one with skill in the art upon review of the following drawings and detailed description. It is intended that all such additional embodiments, in addition to any and all combinations of the above embodiments, be included within this description, be within the scope of the invention, and be protected by the accompanying claims.

DETAILED DESCRIPTION

Figures 1A, 1B:
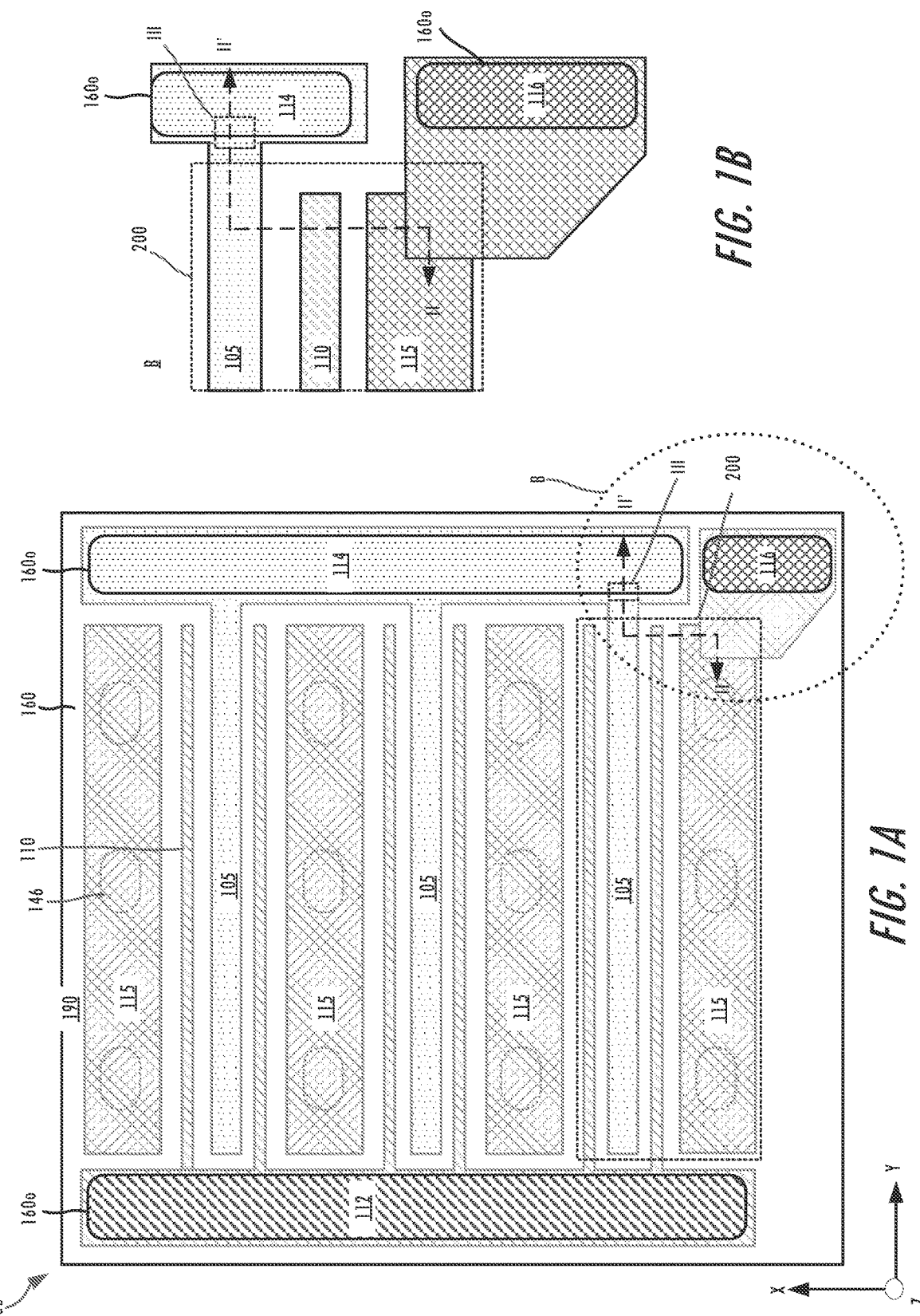
FIG. 1A is a schematic plan view of a semiconductor die including a multi-layer encapsulation structure according to some embodiments of the present invention.
FIG. 1B is an enlarged plan view of region B of FIG. 1A.

Packages for some semiconductor devices may not provide a hermetic seal for environmental protection in some applications. The environment may include an operating environment (i.e., when operating under bias in user application) or a fabrication environment (i.e., under processing conditions that may include different ionic contaminant profiles, such as integration, package technologies, etc.). An encapsulation layer or structure may thus be provided on semiconductor devices at the die level, as protection from humidity and/or other conditions of the operating environment. As used herein, a "die" or chip may refer to a small block or body of semiconducting material or other substrate on which electronic circuit elements are fabricated. A die may include a large number of individual "unit cell" transistor structures, which in some implementations may be connected electrically in parallel or in series. A semiconductor die as described herein may include the semiconductor body as well as the metal and/or insulating layers that are formed thereon.

The encapsulation layer or structure may include one or more non-conductive (e.g. insulating or dielectric) layers or films, one or more of which may be conformal layers. For example, some RF HEMT devices may terminate in a SiN-based PECVD dielectric layer, which may serve as an environmental barrier protecting the underlying active area from external contamination, corrosion, and/or mechanical damage. To further improve robustness to environmental conditions and/or damage during die assembly of semiconductor devices (such as RF or DC transistor devices, including RF HEMTs), one or more additional layers of different materials may be included, providing a multi-layer encapsulation film structure (also referred to herein as an encapsulation structure or stack). The encapsulation structure can include one or more non-conductive layers in a stacked fashion, including for example, SiO, SiN, SiON, and/or AlO layers. Materials described herein with reference to compound chemical formulas (e.g., SiO, AlO) may include different stoichiometries or any compound of the constituent elements (e.g., $SiO_2$, $Al_2O_3$), and in some instances amorphous or crystalline states of the materials.

Some embodiments of the present invention may arise from realization that protective properties of one or more layers of a multi-layer encapsulation structure may be compromised during subsequent fabrication processes, such as patterning processes to define openings that expose one or more layers of an underlying metal interconnection structure (e.g., a source/drain contact or pad, generally referred to as a metal contact structure). In particular, forming an opening in the multi-layer encapsulation structure to expose the metal contact structure may result in sidewalls of the opening that are vertical or discontinuous in slope, due to the various materials of and interfaces between the respective encapsulation layers of the encapsulation stack. Interconnect openings having straight, vertical sidewalls or jagged (i.e., including one or more discontinuities) sidewalls may result in chipping of the sublayer(s) of the encapsulation stack during temperature cycling, and thus moisture ingress into the device, particularly at the interface between the encapsulation layer(s) and the metal layer(s) of the metal contact structure.

For example, exposing a lower metal layer of a multilayer metal contact structure may include a dielectric etching operation to form an opening in the encapsulation layers of the encapsulation structure, followed by a metal etching operation to form an opening in at least one upper metal layer (e.g., a titanium (Ti) layer) of the metal contact structure so as to expose a higher conductivity lower metal layer (e.g., a gold (Au) layer). However, the metal etching operation may also laterally etch one or more of the encapsulation layers, thereby resulting in one or more discontinuities in the sidewalls defining the opening in the encapsulation structure.

Embodiments of the present invention provide materials and fabrication processes for multi-layer encapsulation structures that can address the above and/or other problems. In particular, when etched to define openings that expose the metal contact structure, multi-layer encapsulation structures in accordance with embodiments of the present invention include sidewalls continuously extending through the multiple encapsulation layers to the metal contact structure with a substantially continuous slope, despite interfaces between the different materials of the multiple encapsulation layers. As used herein, a sidewall having a substantially continuous slope may include one or more component sidewalls or edges of layers that continuously extend without or free of a transition from positive to negative (or zero) slope, or vice versa. That is, the substantially continuous slope is free of inflection points or changes in sign of the slope. The sidewall may thus include component sidewall(s) or layer edge(s) that each have a respective positive/increasing slope (or that each have a respective negative/decreasing slope), where the respective positive slopes (or the respective negative slopes) collectively define the substantially continuous slope. The component sidewall(s) or layer edge(s) may each define respective angles that do not vary by more than about 30 degrees (e.g., by less than about 20 degrees less than about 10 degrees, or less than about 5 degrees), such that the respective angles also collectively define a substantially consistent slope.

In some embodiments, the multi-layer encapsulation structure may include a stack of two or more layers of different non-conductive materials and/or formed using fabrication operations that reduce or avoid uneven lateral etching of the respective layers of the encapsulation structure during etching of the metal contact structure. For example, the multi-layer encapsulation structure may include lower or first encapsulation layer(s) implemented by a conformal dielectric material, and an upper or second encapsulation layer(s) of a different dielectric material, such as a polyimide material, on top of the conformal dielectric layer(s). One or more parameters of the etching operations, such as etch chemistry and/or power level, may be configured so as to reduce or minimize lateral etching of the encapsulation layers during the etching of the metal layers. Additionally or alternatively, one or more upper layers of the multi-layer encapsulation structure may be laterally biased relative to one or more lower layers, such that the edge of the upper layer(s) laterally extends beyond the edge of the lower layer(s) to encapsulate the interfaces between one or more metal layers of the metal contact structure and the lower layers of the encapsulation structure and eliminate paths for moisture ingress.

FIG. 1A is a schematic plan view of a semiconductor device or die 100 including a multi-layer encapsulation structure according to some embodiments of the present invention. FIG. 1B is an enlarged plan view of region B of FIG. 1A. As shown in FIGS. 1A and 1B, the semiconductor die 100 includes a semiconductor structure or body 190 on a substrate, for example, a silicon carbide substrate. The semiconductor body 190 may include one or more semiconductor layers, and may be a SiC- and/or Group III nitride-based material in some embodiments. A portion of the semiconductor body 190 may define a channel region of a transistor device. A multi-layer encapsulation structure or stack 160 is provided on the semiconductor body 190 to protect the semiconductor body 190 from humidity and/or other conditions of the environment.

The semiconductor die 100 may include multiple transistor structures 200 connected in parallel to device terminals or electrodes (e.g., an input terminal, an output terminal, and a ground terminal). For example, each of the gate 110, drain contact 105, and source contact 115 may extend in a first direction (e.g., the Y-direction) to define gate, drain, and/or source 'fingers', which may be connected by one or more respective buses (e.g., by a gate bus and a drain bus on an upper surface of the semiconductor structure 190). In FIGS. 1A and 1B, the gate fingers 110, drain fingers 105 and source fingers 115 extend in parallel to each other, with the gate fingers 110 extending from the gate bus in a first direction and the drain fingers 105 extending from the drain bus in a direction opposite the first direction. Each gate finger 110 may be positioned between a drain finger 105 and a source finger 115 to define a unit cell 200. The gate fingers 110, drain fingers 105, and source fingers 115 (and connecting buses) may define part of gate-connected electrodes 112, drain-connected electrodes 114, and source-connected electrodes 116 of the device, respectively, which may be defined by a top or frontside metallization structure. Since the gate fingers 110 are electrically connected to a common gate bus, the drain fingers 105 are electrically connected to a common drain bus, and the source fingers 115 are electrically connected together (e.g., through respective via openings 146 and a backside metal layer on the back surface of the substrate 122), it can be seen that the unit cell transistors 200 are electrically connected together in parallel.

The multi-layer encapsulation structure 160 includes one or more openings 160o that expose the electrodes 112, 114, 116 (or interconnect metal layers thereon) for off-die electrical connections to the gate 110, drain contact 105, and source contact 115. For example, the interconnect metal layers (shown by metal contact structures 365 in FIG. 2) may be (or may be electrically connected to) source and/or drain bus pads adjacent a top surface of the die 100 for wire bond connections to a package (such as the packages 600A, 600B, 600C shown in FIGS. 6A to 6C).

Figures 2A, 2B:
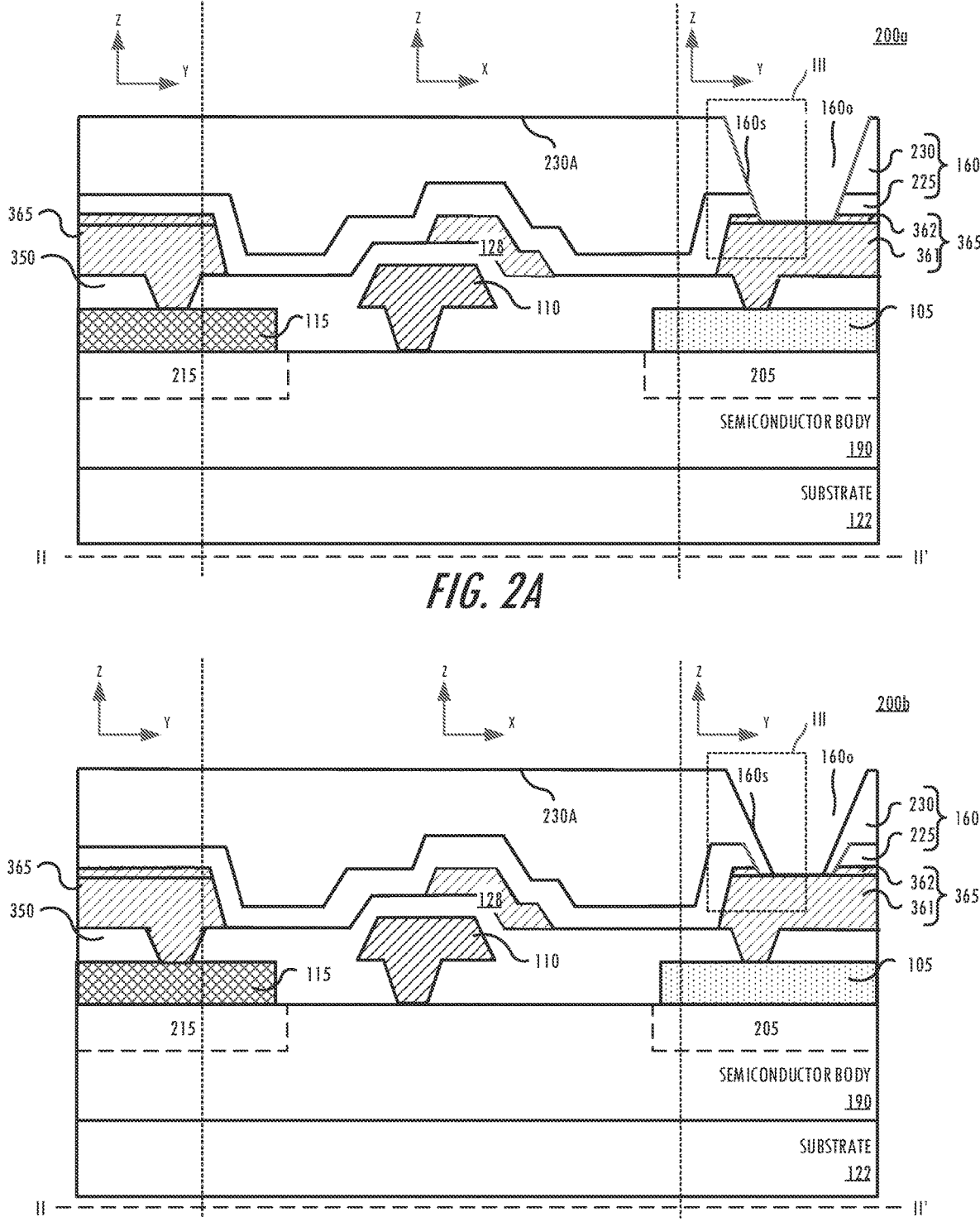
FIGS. 2A and 2B are a schematic cross-sectional views of a semiconductor die including a multi-layer encapsulation structure according to some embodiments of the present invention, taken along line II-II" of FIGS. 1A and 1B.

FIGS. 2A and 2B are a schematic cross-sectional views taken along line of FIGS. 1A-1B illustrating example unit cell transistor structures 200a, 200b (collectively 200) of the die 100, where hundreds or thousands of unit cell transistor structures may be formed on a semiconductor substrate 122 and electrically connected (e.g., in parallel). The substrate 122 may be a semi-insulating SiC substrate. However, embodiments of the present invention may utilize any suitable substrate, such as sapphire (Al₂O₃), aluminum nitride (AlN), aluminum gallium nitride (AlGaN), gallium nitride (GaN), silicon (Si), GaAs, LGO, zinc oxide (ZnO), LAO, indium phosphide (InP), and the like. The substrate 122 may be a SiC wafer, and the transistor structures 200 may be formed, at least in part, via wafer-level processing. The wafer may then be diced or otherwise singulated to provide a die 100 including a plurality of the unit cell transistor structures 200.

The semiconductor body 190 may be a semiconductor layer structure including one or more layers formed by epitaxial growth. The layer(s) of the semiconductor body 190 may include one or more wide bandgap materials such as, for example, one or more Group III nitride-based layers. For example, the semiconductor body 190 may be formed of one or more layers of GaN or AlGaN. However, other Group III nitride materials may be used. As another example, both the substrate 122 and the semiconductor body 190 may be formed of SiC.

A source region 215 and a drain region 205 are formed in the semiconductor body 190, for example, by implanting appropriate ions into a surface of the semiconductor body 190 to achieve a desired doping concentration. A source contact 115 is formed by one or more metallic layers on the surface of the semiconductor body 190 over the source region 215. Likewise, a drain contact 105 is formed by one or more metallic layers on the surface of the semiconductor body 190 over the drain region 205. The source and drain contacts 115 and 105 may provide low-resistance ohmic contacts to the source and drain regions 215 and 205, respectively. A gate 110 is formed by one or more metallic layers on a surface of the semiconductor body 190 between the source region 215 and the drain region 205. A portion of the semiconductor body 190 may define a channel region of the unit cell transistor structure 200. The channel region may extend between the source region 215 and the drain region 205 of the unit cell transistor structure 200. Conduction in the channel region may be controlled by a signal applied to a gate 110. Signals may be applied to the source region 215 via source contact 115 and to drain region 205 via drain contact 105. Metal contact structures 365 may be coupled to the source contact 115 and the drain contact 105 to provide the source and drain signals, respectively. The metal contact structures 365 may schematically represent conductive pads for external connections, and as such, it will be understood that additional conductive layers beyond those illustrated may be present to provide electrical connections to the contacts 105, 115.

In some embodiments, the unit cell transistor structure 200 may be a Metal-Semiconductor Field Effect Transistor (MESFET) device, where the region of the semiconductor body 190 between the source and drain regions 215 and 205 provides the conduction channel or channel region of the MESFET. In some embodiments, the unit cell transistor structure 200 may be a Metal-Oxide Semiconductor Field Effect Transistor (MOSFET) device, where the region of the semiconductor body 190 between the source and drain regions 215 and 205 provides the channel region of the MOSFET, and the gate 110 is separated from the channel region by a gate oxide layer. In some embodiments, the unit cell transistor structure 200 may be a High Electron Mobility Transistor (HEMT) device, where the semiconductor body 190 includes a lower bandgap channel layer on the substrate 122, and a higher bandgap barrier layer on the channel layer 124 opposite the substrate 122. A two-dimensional electron gas (2 DEG) conduction channel can be induced in the region of the semiconductor body 190 between the source and drain regions 215 and 205 along the heterointerface between the channel layer and the barrier layer. In some embodiments, the substrate 122 includes SiC, the channel layer includes GaN, and the barrier layer includes AlGaN. A metal field plate 128 may also be provided, and in some embodiments may be electrically connected to the gate 110 (which may reduce the peak electric field, thereby increasing breakdown voltage and reducing high-field charge trapping effects), or may be electrically connected to the source contact 115 (which may reduce the gate-to-drain capacitance ($C_{gd}$), enhance gain, and/or improve linearity of the device).

Still referring to FIGS. 2A and 2B, one or more passivation layer(s) 350 are formed on a surface of the semiconductor body 190 and the gate 110, drain contact 105, and source contact 115. The passivation layer(s) 350 may be configured to reduce parasitic capacitance, reduce charge trapping, and/or otherwise improve electronic properties of one or more layers of the semiconductor body 190. The passivation layer(s) 350 may include one or more layers of SiN, and may be deposited by a CVD process (such as PECVD) in some embodiments. Metal contact structures 365 may extend through openings in the passivation layer(s) 350 to provide electrical connections to the gate 110, drain contact 105, and source contact 115.

A multi-layer encapsulation structure 160 is formed on the passivation layer(s) 350 and on the metal contact structures 365 opposite the semiconductor body 190. The multi-layer encapsulation structure 160 includes two or more layers of respective non-conductive materials having different characteristics formed in a stacked structure, which are illustrated by way of example with reference to a first, lower encapsulation layer 225 and a second, upper encapsulation layer 230. However, it will be understood that multi-layer encapsulation structures 160 as described herein are not limited to two layers, and may include three or more layers in some embodiments. In some embodiments, the first, lower encapsulation layer(s) 225 may be configured to conformally extend along underlying layers or structures, while the second, upper encapsulation layer(s) 230 may be configured to provide a planar surface opposite the underlying layers or structures.

The first encapsulation layer(s) 225 may include one or more conformal dielectric layers that are blanket-deposited on the semiconductor body 190 and the structures or layers thereon. For example, the first encapsulation layer(s) 225 may include SiO (e.g., SiO₂), SiN, SiON, AlO (e.g., Al₂O₃), or any combination thereof. The first encapsulation layer(s) 225 may be deposited using wafer-level processing methods such as CVD, PECVD, PVD, ALD, or any combination thereof. The first encapsulation layer(s) 225 may be formed to a thickness of about 1 μm to about 1.5 μm, for example, about 1.15 to about 1.4 μm. The thickness of the first encapsulation layer(s) 225 may be substantially uniform along the underlying layers or structures. The first encapsulation layer(s) 225 may be passivation layers in some embodiments. For example, the first encapsulation layer(s) 225 may include one or more layers of SiN.

The second encapsulation layer(s) 230 may be formed directly on the first encapsulation layer(s) 225. The second encapsulation layer(s) 230 may include one or more dielectric or other non-conductive materials, for example, polyimide, benzocyclobutene (BCB), glass (e.g. borosilicate glass (BSG)), polyamide, polybenzoxazole (PBO), and/or a photoresist (e.g. SU-8), which are different than the material(s) of the first encapsulation layer(s) 225. Other epoxies and/resins may also be used without deviating from the embodiments of the present disclosure. The second encapsulation layer(s) 230 may be formed using deposition techniques such as spin-on, spray-on, vapor deposition, slot die, electroplating and/or blade-coating. The second encapsulation layer(s) 230 may be formed to a thickness of about 3 µm to about 7.5 µm, which may be non-uniform depending on the underlying structures. For example, the thickness of the second encapsulation layer(s) 230 may vary between about 3.1 to about 4.1 µm (e.g., over the metal contact structures 365), about 4.7 to about 5.6 µm (e.g., over the gate 110), or about 6.2 to about 7.2 µm (e.g., over the source/drain access regions between the gate 110 and the source or drain contacts 115 or 105).

In some embodiments, an upper surface 230A of the second encapsulation layer(s) 230 may be substantially planar, despite the varying contours of the underlying structures. For example, the second encapsulation layer(s) 230 may include a curable dielectric layer formed in a viscous or liquid state, which may initially fill-in surface irregularities (pin holes, columnar structures, etc.) or other non-planarity in the underlying encapsulation layer(s) 225, to define a substantially planar surface 230A opposite the first encapsulation layer. For example, the second encapsulation layer(s) 230 may include a material having a kinematic viscosity of 100 to 8000 centistokes (cSt). The material of the second encapsulation layer(s) 230 may have a cure temperature of less than about 275° C. (e.g., less than about 250° C., 200° C., or 175° C., in some instance with a cure time of at least about 1 hour), such that the layer(s) 230 can be fully cured at a temperature that will not damage other elements of the semiconductor device 100. That is, the second encapsulation layer(s) 230 may be self-planarized. Further examples and details of possible curable (also referred to herein as planarized) dielectric materials for use as the second encapsulation layer(s) are described in U.S. application Ser. No. 17/390,020, the disclosure of which is incorporated by reference herein.

As shown in FIGS. 1A-2B, the multi-layer encapsulation structure 160 further includes one or more openings 160o extending through the first and second encapsulation layers 225 and 230 to expose the metal contact structures 365. For example, the metal contact structures 365 may include a higher conductivity contact metal layer 361, and one or more lower conductivity layers 362 (e.g., a barrier metal layer and/or an adhesion layer) thereon. The contact metal layer may include one or more materials, alloys, and/or layers configured to provide desired device performance characteristics, for example, low electrical resistance and high electrical current carrying capability. The barrier metal layer may include one or more materials, alloys, and/or layers configured to prevent migration of the material(s) of the contact metal layer into overlying or underlying layers. The adhesion metal layer may include one or more materials, alloys, and/or layers configured to promote adhesion to overlying or underlying layers. In some embodiments, the adhesion metal layer may include titanium (Ti), the barrier metal layer may include Ti, titanium tungsten (TiW), and/or platinum (Pt), and the contact metal layer may include gold (Au).

As described in greater detail below, the materials and methods of fabricating the encapsulation structure 160 are configured to provide the opening 160o with a sidewall 160s having a substantially continuous slope that extends through the first and second encapsulation layers 225 and 230 to expose the metal contact structures 365. For example, the encapsulation structure 160 may include the first and second encapsulation layers 225 and 230 in a non-biased configuration (where the sidewall 160s includes an edge of the second encapsulation layer 230 and an edge of the first encapsulation layer 225 to define the substantially continuous slope, as shown in FIG. 2A), or in a biased configuration (where the sidewall 160s primarily includes the edge of the second encapsulation layer 230, which is laterally offset to and extends beyond the edge of the first encapsulation layer 225 to define the substantially continuous slope, as shown in FIG. 2B).

FIGS. 3A to 3F are enlarged cross-sectional views of region III of FIGS. 1A-2B illustrating an opening 160o in an encapsulation structure 160 that exposes a metal contact structure 365 according to some embodiments of the present invention. As shown in FIGS. 3A to 3F, the opening 160o includes a sidewall 160s that extends from an upper surface of the encapsulation structure 160 to the metal contact structure 365. The sidewall 160s has a substantially continuous slope, which is free of transitions from negative slope to positive (or zero) slope, or vice versa. As such, the sidewall 160s is continuous (rather than discontinuous or jagged) and angled (rather than vertical), which may reduce and/or avoid problems with chipping and/or moisture ingress. It will be understood that, while not specifically shown, openings as described herein may subsequently be filled with one or more conductive layers, for example, to define a bond pad for connections to external devices. That is, an opening may include filled structures in a completed device. Likewise, regions or portions of layers described herein as "exposed" by an opening in another layer or region remain exposed by the opening even when subsequently covered.

In the examples of FIGS. 3A to 3F, the metal contact structure 365 is implemented by a stacked multi-layer configuration including a first, higher conductivity metal layer 361 (such as an Au-based contact metal layer) and a second, lower conductivity metal layer 362 (such as a Ti-based adhesion and/or barrier metal layer) that is between the first metal layer 361 and the encapsulation structure 160, where the opening 160o extends through the second metal layer 362 to expose a surface of the first metal layer 361. However, it will be understood that metal contact structures 365 as described herein are not limited to two-layer structures, and may include fewer or more conductive layers than those illustrated.

Figure 3A:
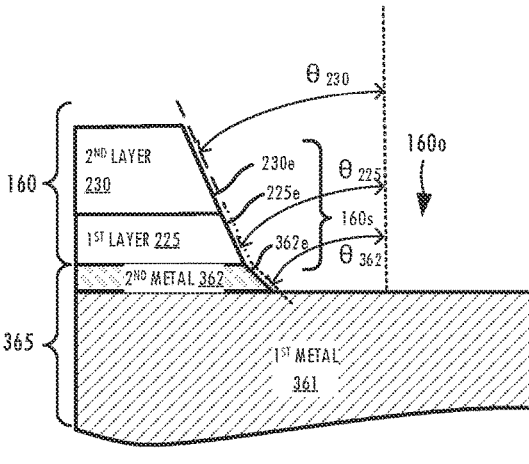
FIGS. 3A, 3B, 3C, 3D, 3E, and 3F are enlarged cross-sectional views of region III of FIGS. 1A, 1B, and 2.
Figure 3B:
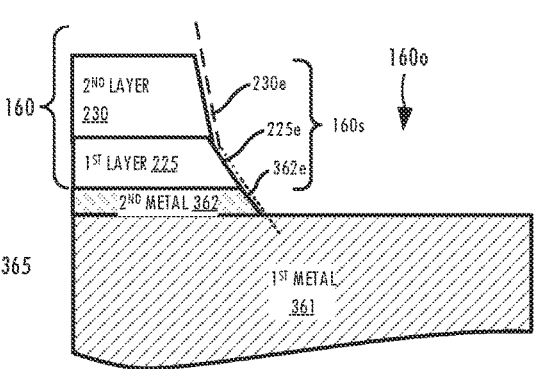
Figure 3C:
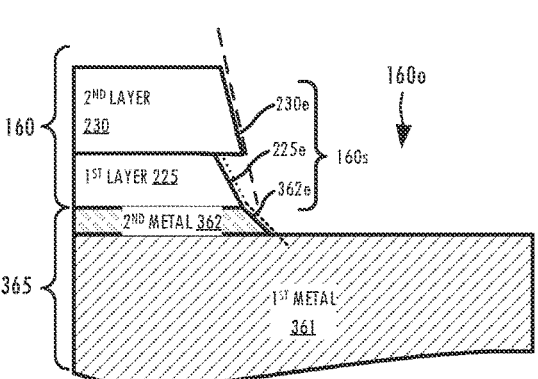

In greater detail, FIGS. 3A to 3C illustrate an encapsulation structure 160 including first and second encapsulation layers 225 and 230 in a non-biased configuration, where the sidewall 160s includes an edge 230e of the second encapsulation layer 230, an edge 225e of the first encapsulation layer 225, and an edge 362e of the second metal layer 362 adjacent the opening 160o, each having a respective slope (shown by dashed or dotted lines) which collectively define the substantially continuous slope or profile of the sidewall 160s. The respective slopes defining the sidewall 160s are thus either all negative slopes, or are all positive slopes.

The relative slopes of the edges 230e, 225e, and/or 362e may be critical to providing the encapsulation structure 160 with advantageous encapsulation properties as described herein (e.g., reduced chipping, reduced moisture ingress). For example, the slope of the edge 362e of the second metal layer 362 may be less than or equal to the slope of the edge 225e of the first encapsulation layer 225. The slope of the edge 230e of the second encapsulation layer 230 may be greater than or equal to the slope of the edge 225e of the first encapsulation layer 225.

In particular, FIG. 3A illustrates an example in which the sidewall 160s includes the edges 230e, 225e, and 362e, where the slope of the edge 230e of the second encapsulation layer 230 is substantially equal to the slope of the edge 225e of the first encapsulation layer 225, while the slope of the edge 362e of the second metal layer 362 is less than the slope of the edge 225e of the first encapsulation layer 225. FIG. 3B illustrates an example in which the sidewall 160s includes the edges 230e, 225e, and 362e, where the slope of the edge 230e of the second encapsulation layer 230 is greater than the slope of the edge 225e of the first encapsulation layer 225, while the slope of the edge 362e of the second metal layer 362 is substantially equal to the slope of the edge 225e of the first encapsulation layer 225. FIG. 3C illustrates an example in which the sidewall 160s includes the edges 230e, 225e, and 362e, each having a different slope, with the slope of the edge 230e of the second encapsulation layer 230 greater than the slope of the edge 225e of the first encapsulation layer 225, and the slope of the edge 362e of the second metal layer 362 less than the slope of the edge 225e of the first encapsulation layer 225. Also, in FIG. 3C, the edge 230e of the second encapsulation layer 230 laterally extends toward the opening 160o beyond the edge 225e of the first encapsulation layer 225. In this configuration, the edge 225e of the first encapsulation layer 225 (and/or the edge 362e of the second metal layer 362) may be confined within a plane defined by the edge 230e of the second encapsulation layer 230.

Figure 3D:
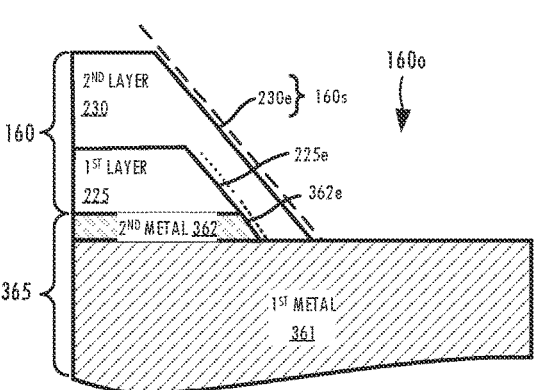
Figure 3E:
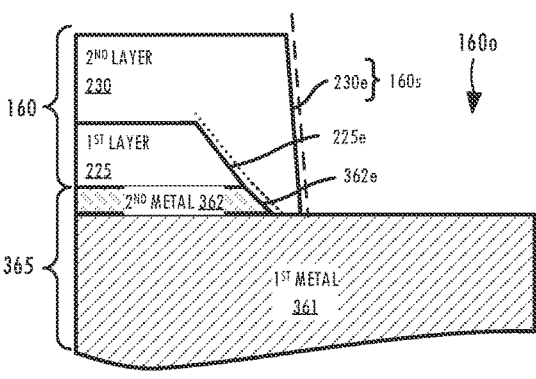
Figure 3F:
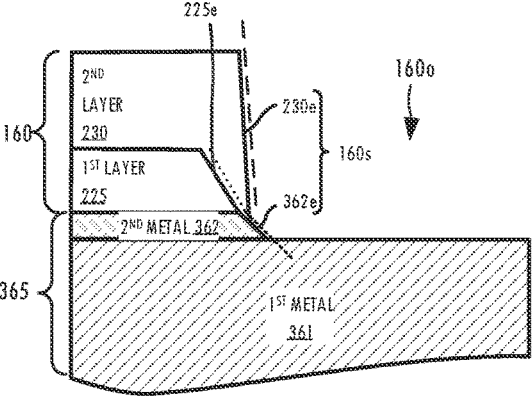

FIGS. 3D to 3F illustrate an encapsulation structure 160 including first and second encapsulation layers 225 and 230 in a biased configuration, where the edge 230e of the second encapsulation layer 230 is laterally offset to and extends beyond the edge 225e of the first encapsulation layer 225 relative to the opening 160o, and beyond/on an interface between the first encapsulation layer 225 and the second metal layer 362. The sidewall 160s thus primarily includes the edge 230e of the second encapsulation layer 230 to define the substantially continuous slope or profile with a positive or negative slope. The biased configuration shown in FIGS. 3D to 3F can prevent exposure of the edge 362e of the second metal layer 362 (and/or the interface between the second metal layer 362 and the first encapsulation layer 225) to the ambient environment during subsequent processing operations, which may otherwise provide a path for moisture ingress.

In particular, FIGS. 3D and 3E illustrates examples where the sidewall 160s includes the edge 230e of the second encapsulation layer 230, and continuously extends directly onto the surface of the first metal layer 361 along the edge 225e of the first encapsulation layer and the edge 362e of the second metal layer 362. As such, the edge 362e of the second metal layer 362 and the edge 225e of the first encapsulation layer 225 adjacent the opening 160o are laterally confined within the edge 230e of the second encapsulation layer 230. In FIG. 3D, the slope of the edge 230e of the second encapsulation layer 230 is substantially equal to the slope of the edge 225e of the first encapsulation layer 225, while the slope of the edge 362e of the second metal layer 362 is greater than the slope of the edge 225e of the first encapsulation layer 225. In FIG. 3E, the slope of the edge 230e of the second encapsulation layer 230 is greater than the slope of the edge 225e of the first encapsulation layer 225, while the slope of the edge 362e of the second metal layer 362 is substantially equal to the slope of the edge 225e of the first encapsulation layer 225.

FIG. 3F illustrates an example in which the sidewall 160s includes the edge 230e of the second encapsulation layer 230 and part of the edge 362e of the second metal layer 362. The sidewall 160s thus extends along the edge 225e of the first encapsulation layer 225 beyond an interface between the first encapsulation layer 225 and the second metal layer 362, but does not directly contact the surface of the first metal layer 361. In FIG. 3F, the edges 230e, 225e, and 362e are illustrated as each having a different slope, with the slope of the edge 230e of the second encapsulation layer 230 greater than the slope of the edge 225e of the first encapsulation layer 225, and the slope of the edge 362e of the second metal layer 362 less than the slope of the edge 225e of the first encapsulation layer 225. That is, when the edges 225e and/or 362e are laterally confined within the edge 230e of the second encapsulation layer 230, the relative slopes of the edges 225e and/or 362e may be less critical, as the edge 230e primarily defines the slope of the sidewall 160s.

In the embodiments shown in FIGS. 3A to 3F, the edges 230e, 225e, and 362e of the layers 230, 225, and 362 adjacent the opening 160o, when viewed in cross-section, may define respective angles θ (shown in FIG. 3C as $\theta_{230}$, $\theta_{225}$, and $\theta_{362}$) relative to a normal to the exposed surface of the first metal layer 361 of the metal contact structure 365. The respective angles of the edges 230e, 225e, and 362e may not vary by more than about 30 degrees (e.g., a variation of less than about 20 degrees, less than about 15 degrees, or less than about 10 degrees), so as to collectively define the sidewall 160s with a substantially consistent slope. For example, a difference between the angle of the edge 225e and the angle of the edge 362e may be less than about 15 degrees (e.g., less than about 10 degrees, or less than about 5 degrees), while a difference between the angle of the edge 225e and the angle of the edge 230e may be less than about 15 degrees (e.g., less than about 10 degrees, or less than about 5 degrees). In some embodiments, each of the respective angles θ may each be between about 35 to 55 degrees (e.g., about 45 degrees, with a variation of ±10 degrees), for example, between about 40 to 50 degrees (e.g., about 45 degrees, with a variation of ±5 degrees) relative to the normal to the surface of the first metal layer 361 (or relative to the surface of the first metal layer 361 itself). That is, the materials and/or operations for patterning the multi-layer film may be selected to provide sidewall slopes of the respective encapsulation layers 230, 225, and/or metal layer 362 that are substantially consistent (i.e., with a variation of less than about 30 degrees) and/or substantially continuous (i.e., without inflection points) along the sidewalls 160s of the opening 160 exposing the metal contact structure 365 or metal layers 361 thereof.

Figure 4A:
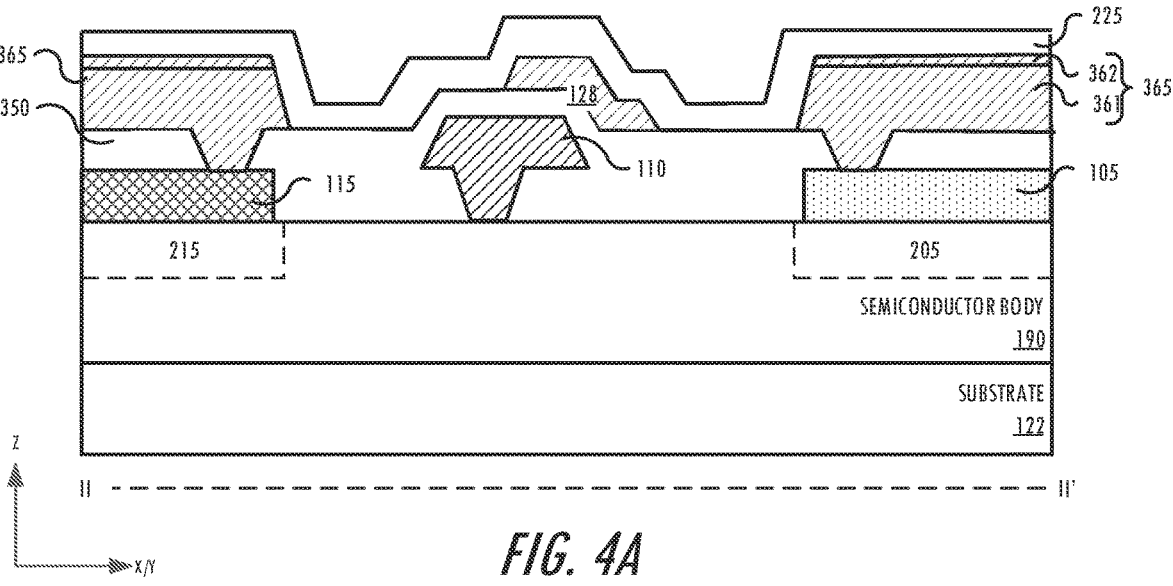
FIGS. 4A, 4B, 4C, 4D, and 4E are schematic cross-sectional views illustrating methods of fabricating a semiconductor die including a multi-layer encapsulation structure according to some embodiments of the present invention.

FIGS. 4A to 4E are schematic cross-sectional views illustrating methods of fabricating a semiconductor die including a multi-layer encapsulation structure in a non-biased configuration according to some embodiments of the present invention. As shown in FIG. 4A, a first encapsulation layer 225 is formed on a semiconductor device and the structures or layers thereon. As discussed above, the semiconductor device includes a substrate 122, a semiconductor body 190 having source and drain regions 215 and 205 therein, source and drain contacts 115 and 105 on the source and drain regions 215 and 205, and a gate 110 on a surface of the semiconductor body 190 between the source and drain contacts 115 and 105. Metal interconnect or contact structures 365 are formed to extend through one or more passivation layer(s) 350 to provide electrical connections to the gate 110, source contact 115, and drain contact 105. A conductive field plate 128 may also be formed in some embodiments. The first encapsulation layer 225 may include one or more dielectric layers that are blanket-deposited (e.g., using CVD, PECVD, PVD, and/or ALD) so as to conformally extend along the metal contact structures 365, passivation layer(s) 350, and field plate 128 (when present). For example, the first encapsulation layer 225 may include SiO (e.g., $SiO_2$), SiN, SiON, AlO (e.g., $Al_2O_3$), or any combination thereof.

Figure 4B:
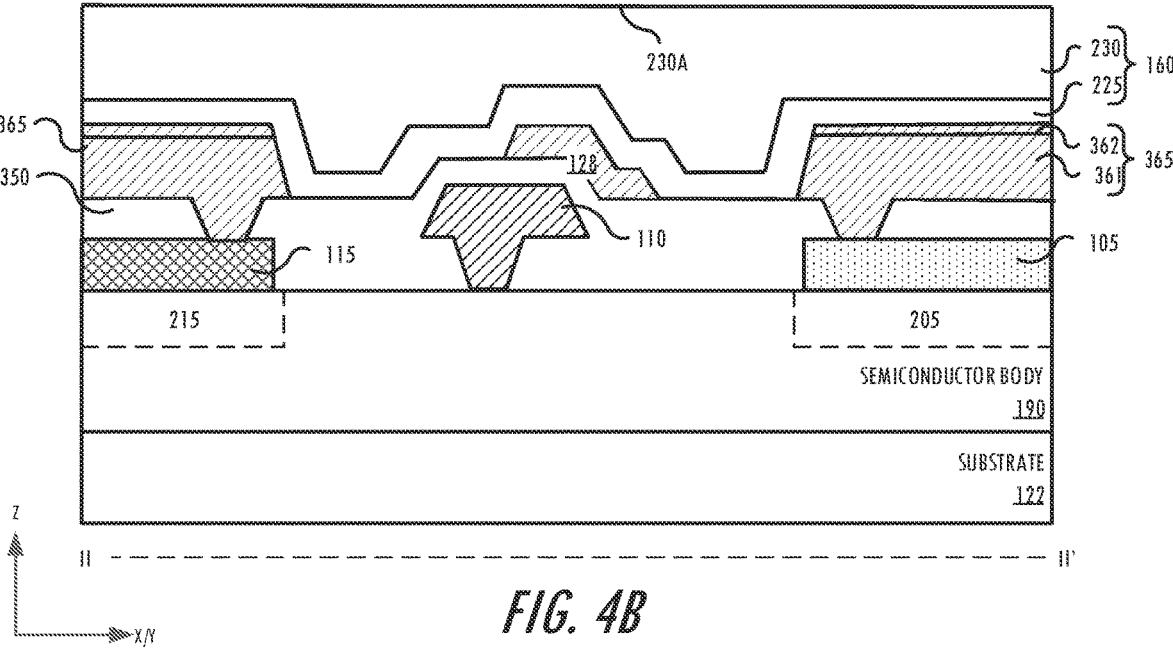

As shown in FIG. 4B, a second encapsulation layer 230 is formed directly on the first encapsulation layer 225 to define a multi-layer encapsulation structure 160. The second encapsulation layer 230 may include one or more dielectric or other non-conductive materials that are formed on the first encapsulation layer 225 using deposition techniques such as spin-on, spray-on, vapor deposition, slot die, electroplating and/or blade-coating. The first and second encapsulation layers 225 and 230 are formed of different materials, and thus may have different etch selectivities in subsequent fabrication operations. For example, the second encapsulation layer 230 may include polyimide, BCB, BSG, polyamide, PBO, and/or SU-8. In some embodiments, the second encapsulation layer 230 may be a curable dielectric layer formed in a viscous or liquid state, which may initially fill-in surface irregularities or other non-planarity in the underlying first encapsulation layer 225, and may be cured to define a substantially planar surface 230A opposite the first encapsulation layer 225, despite the varying contours of the underlying structures.

Figure 4C:
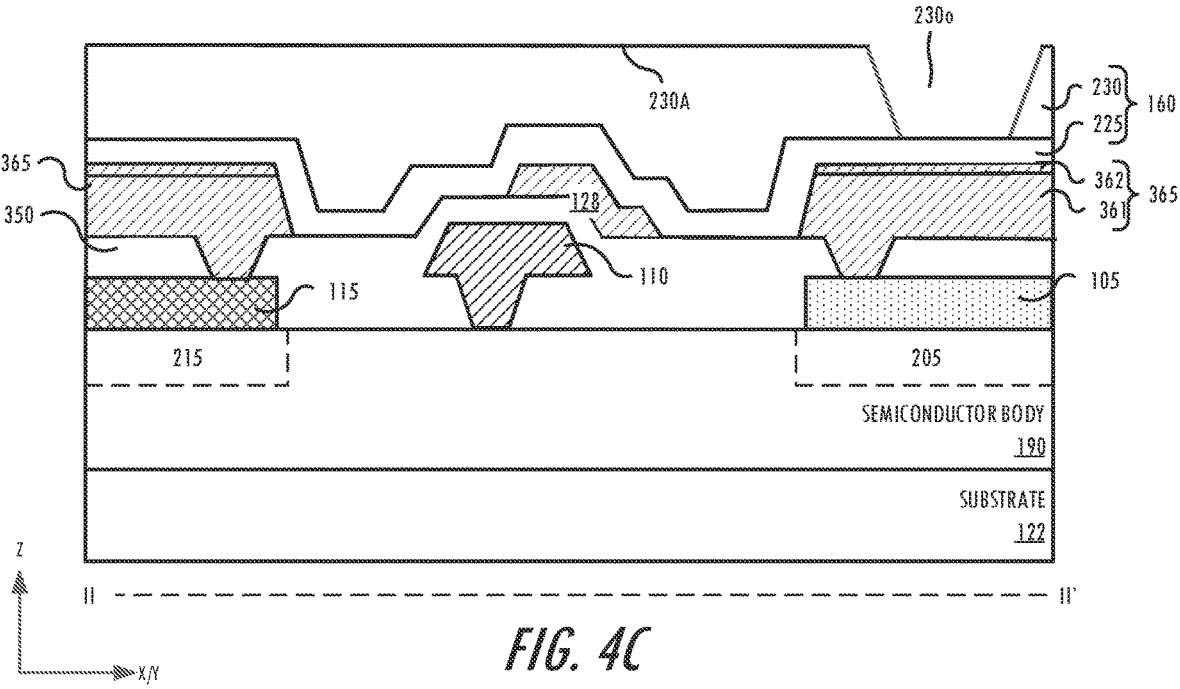

The encapsulation structure 160 is patterned to define respective openings 160o that expose respective metal contact structures 365. The openings 160o may be formed by one or more etching processes. For example, as shown in FIG. 4C, the second encapsulation layer 230 is patterned to define openings 230o that expose portions of the first encapsulation layer 225. That is, the second encapsulation layer 230 provides a patterning layer or etch mask for etching the first encapsulation layer 225 to expose the overlying metal layer 362 of the metal contact structure 365. For example, the second encapsulation layer 230 may be a photosensitive layer that can be patterned (e.g., developed, using photolithography techniques) to expose the encapsulation layer 225, while simultaneously functioning as a hard mask for the etching of the first encapsulation layer 225 (and/or the overlying metal layer 362 of the metal contact structure 365). In particular, the second encapsulation layer 230 may be a polyimide layer that is reactive to ultraviolet (UV) light.

Figure 4D:
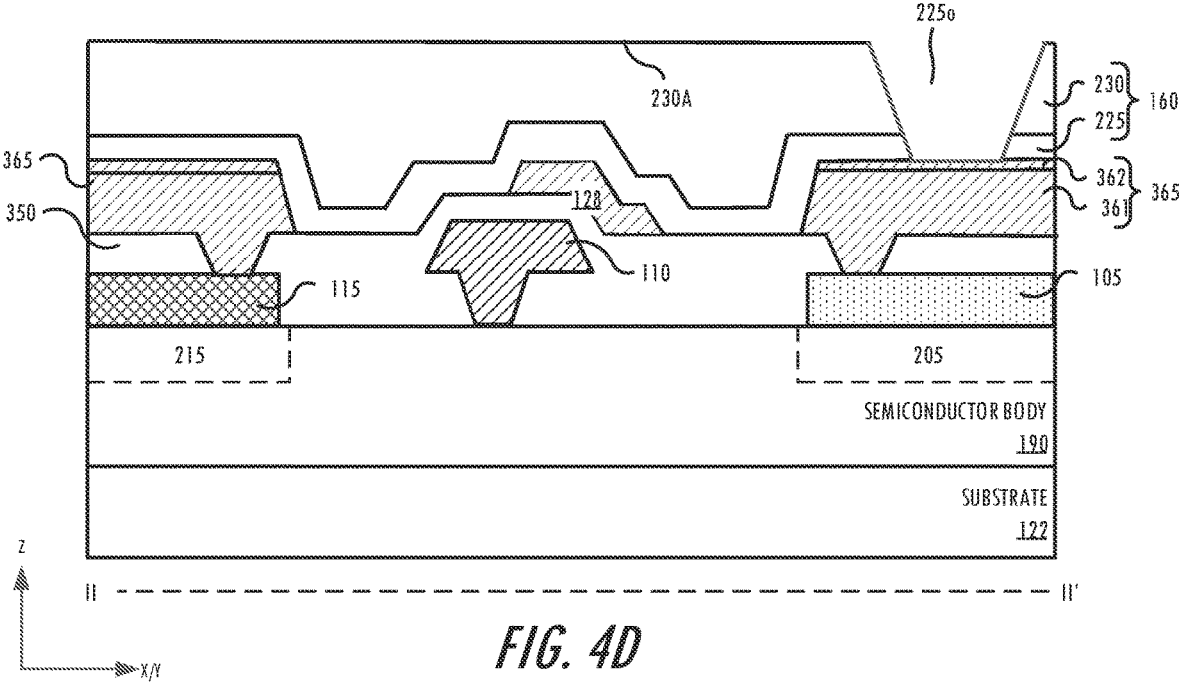

In FIG. 4D, the first encapsulation layer 225 is patterned using a directional etching process to define an opening 225o that exposes the metal contact structure 365. The etching of the first encapsulation layer 225 may be performed using a selective etch chemistry and/or a power level that is configured to remove the exposed portions of the first encapsulation layer 225 without substantial lateral etching of the edges 230e of the second encapsulation layer 230. For example, the etching process may be a directional etching process performed at a relatively low power (e.g., less than about 200 W, such as about 180 W), and using an etch chemistry including one or more passivation gases (e.g., using $NF_3$, $N_2O$, and $CHF_3$). In some embodiments, the second encapsulation layer 230 may be polyimide, the first encapsulation layer 225 may be silicon nitride, and the passivation gas(es) may include $CHF_3$ or other passivating species configured to improve etch selectivity with respect to the first encapsulation layer 225 and reduce or minimize lateral etching of the edges 230e of the second encapsulation layer 230.

Figure 4E:
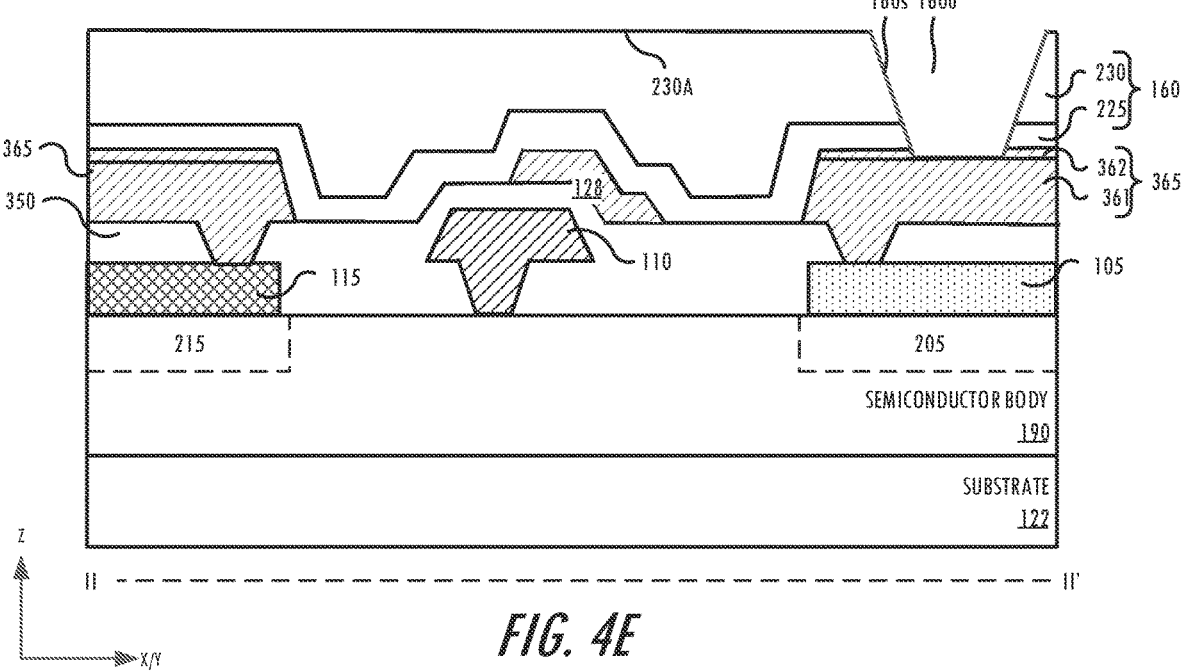

As shown in FIG. 4E, the second, overlying metal layer 362 of the metal contact structure 365 is patterned using a metal etching process to expose the first, underlying metal layer 361 through opening 160o. The etching of the second metal layer 362 may be performed using a selective etch chemistry and/or a power level that is configured to remove portions of the second metal layer 362 without substantial lateral etching of the edges 225e and/or 230e of the first and/or second encapsulation layers 225, 230. For example, the etching process may be a directional etching process performed at a relatively high power (e.g., greater about 300 W, such as about 400 W), and using an etch chemistry including one or more passivation gases (e.g., using $NF_3$, Ar, and $CHF_3$). In some embodiments, the second metal layer 362 may be a lower-conductivity adhesive or barrier layer (e.g., Ti), the first metal layer 361 may be a higher conductivity layer (e.g., Au), and the passivation gas(es) may include $CHF_3$ or other passivating species configured to improve etch selectivity with respect to the second metal layer 362 and reduce or minimize lateral etching of the edges 225e and/or 230e of the first and/or second encapsulation layers 225, 230.

The etching processes shown in FIGS. 4E and 4F may use a passivating species (e.g., predominantly $CHF_3$) configured to increase etch selectivity and reduce erosion of the second encapsulation layer 230 (e.g., the polyimide material), resulting in a better-matched profile for the edges 230e, 225e, 362e of each of the layers 230, 225, and 362 defining the sidewall 160s having the substantially continuous slope, despite differences in lateral etch rates of the layers 230, 225, and/or 362. That is the etch chemistries, layer materials, and/or layer thicknesses of the multi-layer encapsulation structure 160 may thus be configured such that differences in lateral etching of the layers 230, 225 of the multi-layer dielectric stack is reduced or minimized, particularly during the etching of overlying metal layer 362 or other layers of the metal contact structure 365. The power levels of the etch processes may also be selected based on the desired etch rate and selectivity. As such, an etch profile defining sidewalls 160s extending between opposing surfaces of the multi-layer encapsulation structure 160 with a substantially continuous slope may be achieved, despite the different material layers in the stack 160.

In further embodiments, the edge 230e of the second encapsulation layer 230 may primarily define the sidewall 160s of the opening 160, and may be laterally biased (for example, by photolithographic patterning) relative to the edge 225e of the first encapsulation layer 225. That is, the edge 230e of the second encapsulation layer 230 may laterally extend beyond the edge 225e of the first encapsulation layer 225 along the sidewall 160s of the opening 160. The amount of lateral bias of the second encapsulation layer 230 may be sufficient to encapsulate the edges of the adhesion and/or barrier metal layers 362 of the metal contact structure 365 (e.g. one or more Ti-based layers) to expose the underlying metal contact layer 361 (e.g., Au).

Figure 5A:
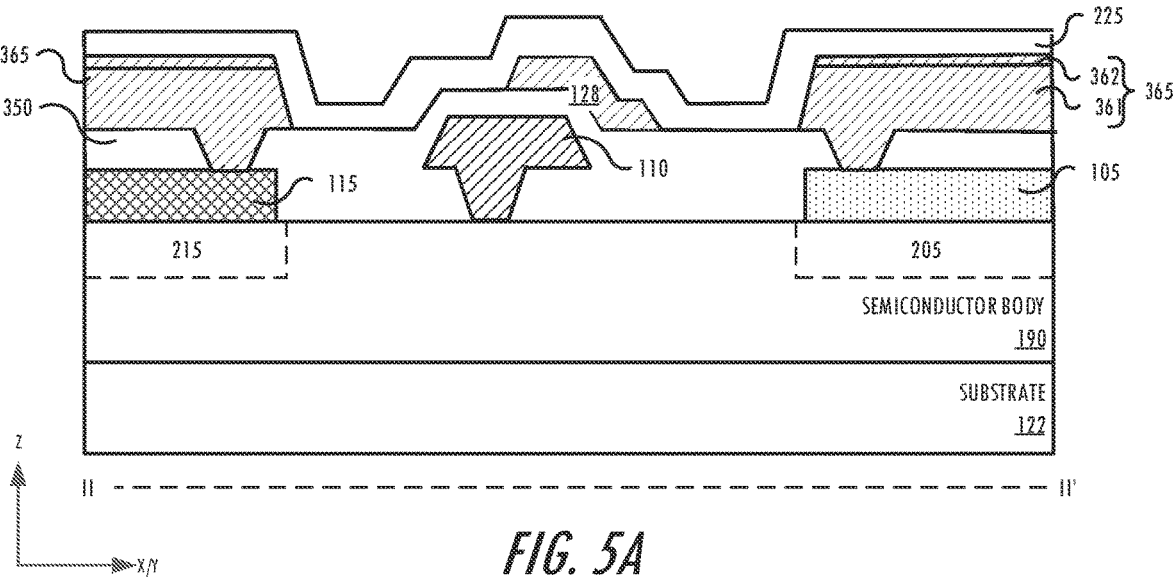
FIGS. 5A, 5B, 5C, 5D, and 5E are schematic cross-sectional views illustrating methods of fabricating a semiconductor die including a multi-layer encapsulation structure according to further embodiments of the present invention.
Figure 5B:
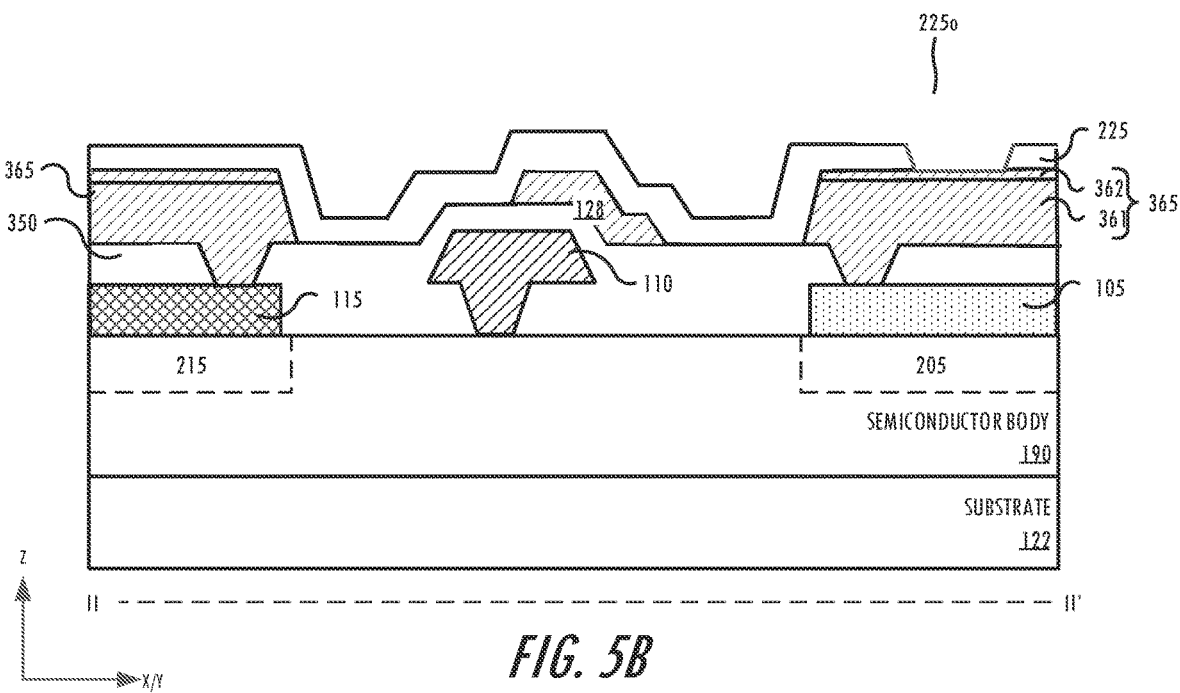

FIGS. 5A to 5E are schematic cross-sectional views illustrating methods of fabricating a semiconductor die including a multi-layer encapsulation structure in a biased configuration according to further embodiments of the present invention. As shown in FIG. 5A, a first encapsulation layer 225 is formed on a semiconductor device and the structures or layers thereon, for example, as similarly discussed above with reference to FIG. 4A. In FIG. 5B, the first encapsulation layer 225 is patterned using a directional etching process to define an opening 225o that exposes the metal contact structure 365. The etching of the first encapsulation layer 225 may be performed by forming a mask pattern (not shown) on the first encapsulation layer 225 and etching areas exposed by the mask pattern, for example, using a selective etch chemistry and/or power level as similarly discussed above with reference to FIG. 4D.

Figure 5C:
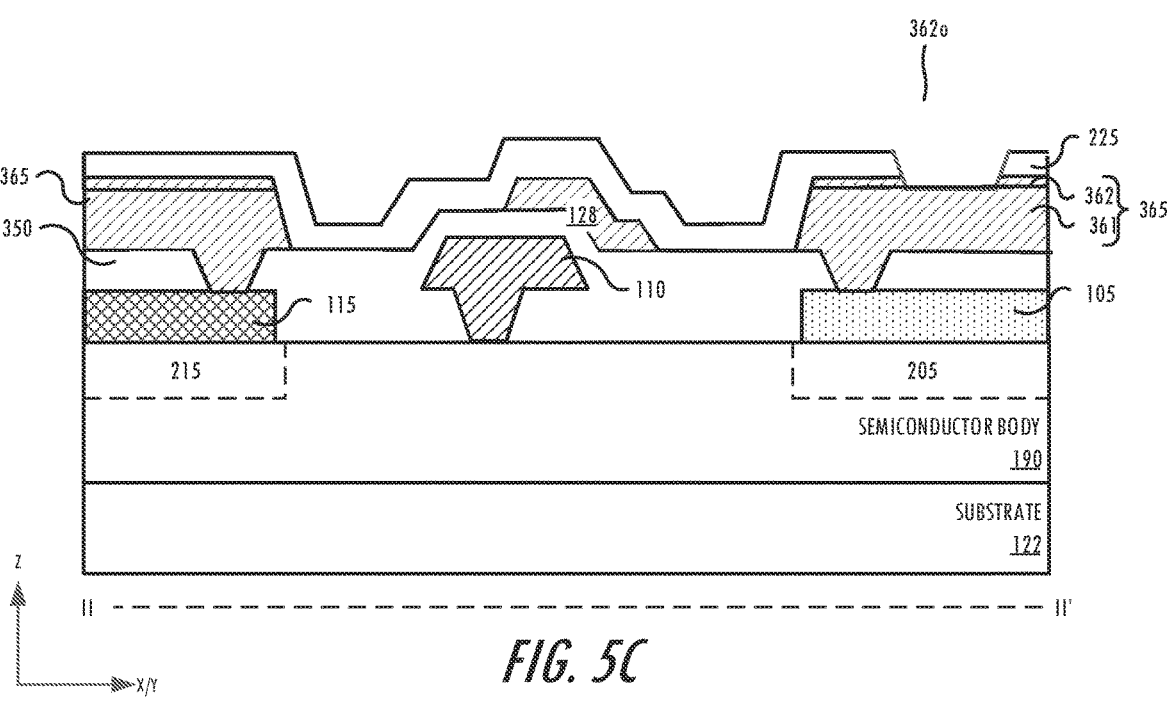

In FIG. 5C, the second, overlying metal layer 362 of the metal contact structure 365 is patterned using a metal etching process to define an opening 362o that exposes the first, underlying metal layer 361. The first encapsulation layer 225 may function as a mask for etching the second metal layer 362. The etching of the second metal layer 362 may be performed using a selective etch chemistry and/or power level as similarly discussed above with reference to FIG. 4E.

Figure 5D:
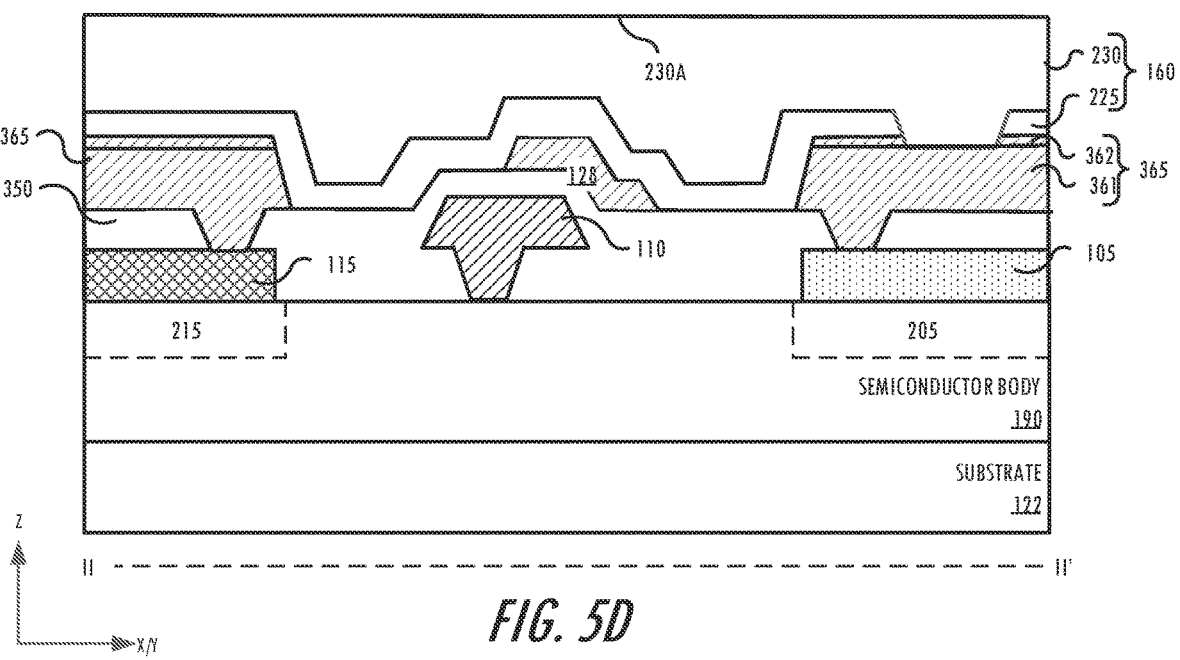

As shown in FIG. 5D, a second encapsulation layer 230 is formed directly on the first encapsulation layer 225 and the metal contact structure 365 to define the multi-layer encapsulation structure 160. The second encapsulation layer 230 may include one or more dielectric or other non-conductive materials that are formed on the first encapsulation layer 225 and the metal contact structure 365 using deposition techniques, as similarly discussed above with reference to FIG. 4B. In some embodiments, the second encapsulation layer 230 may be a curable dielectric layer formed in a viscous or liquid state, which may initially fill-in surface irregularities or other non-planarity in the underlying first encapsulation layer 225, and may be cured to define a substantially planar surface 230A opposite the first encapsulation layer 225, despite the varying contours of the underlying structures.

Figure 5E:
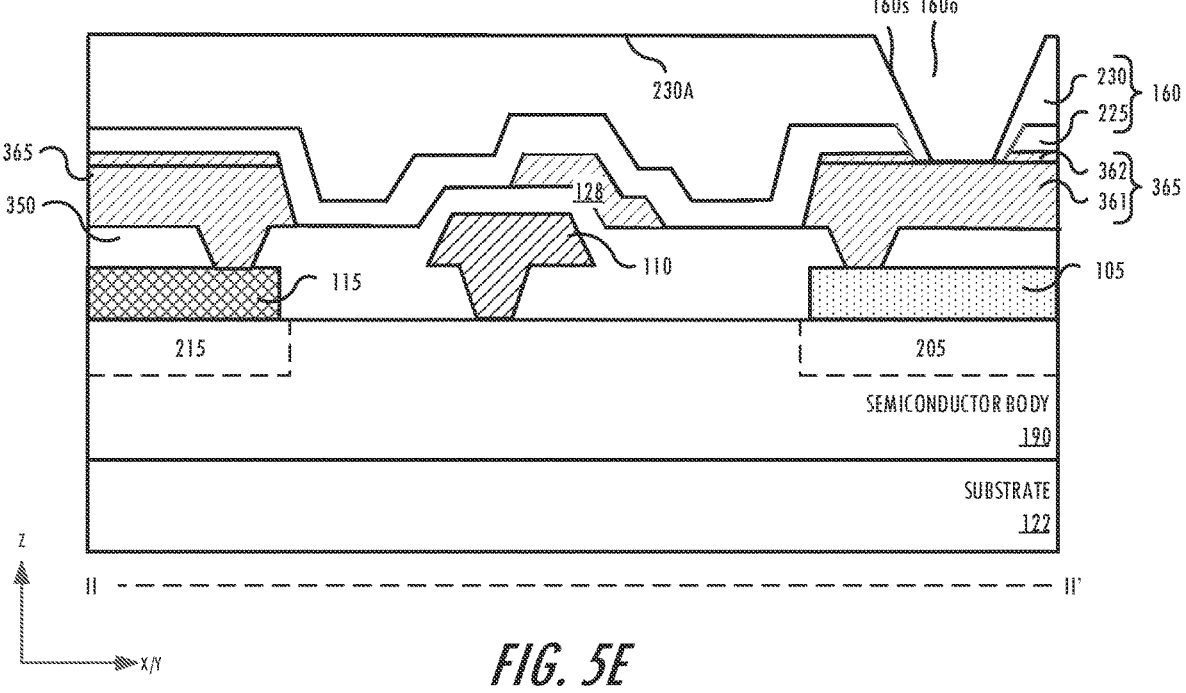

In FIG. 5E, the second encapsulation layer 230 is patterned to define opening 160o that expose the first metal layer 361 of the metal contact structure 365. For example, the second encapsulation layer 230 may be a photosensitive layer that can be patterned (e.g., developed, using photolithography techniques) to expose the metal contact structure 365. In particular, the second encapsulation layer 230 may be a polyimide layer that is reactive to UV light. The second encapsulation layer 230 may extend beyond, over, and/or otherwise cover the edge 225e of the first encapsulation layer 225 of the encapsulation stack 160, so as to fully encapsulate the edge 225e of the first encapsulation layer 225 adjacent the opening 160o. That is, the edge 225e of the first encapsulation layer 225 may not laterally extend beyond a plane of an edge 230e of the second encapsulation layer 230 adjacent the opening 160o. As such, a majority or entirety of the sidewall 160s of the opening 160o may be defined by the edge 230e of the second encapsulation layer 230, which may extend from the surface 230A of the encapsulation structure 160 directly onto the metal contact structure 365.

Multi-layer encapsulation structures 160 in accordance with some embodiments of the present invention may be advantageous in comparison to some conventional devices at least in that the metal contact structures or interconnects are exposed by openings in the encapsulation structure defined by smooth, angled film edges or sidewalls with substantially continuous slope that continuously extend through the encapsulation film sublayers, which may reduce chipping of the multi-layer stack 160 and/or moisture ingress. In some embodiments, the sidewalls 160s of the openings 160o may define a 40-50 degree slope (relative to a normal to the exposed surface of the first metal layer 361 of the metal contact structure 365) that continues through multiple or all layers 225, 230 of the multi-layer encapsulation stack 160. As such, embodiments of the present invention may provide continuous sidewall step coverage of the encapsulation structure over the metal contact structures and/or other components of the semiconductor device.

Figure 6A:
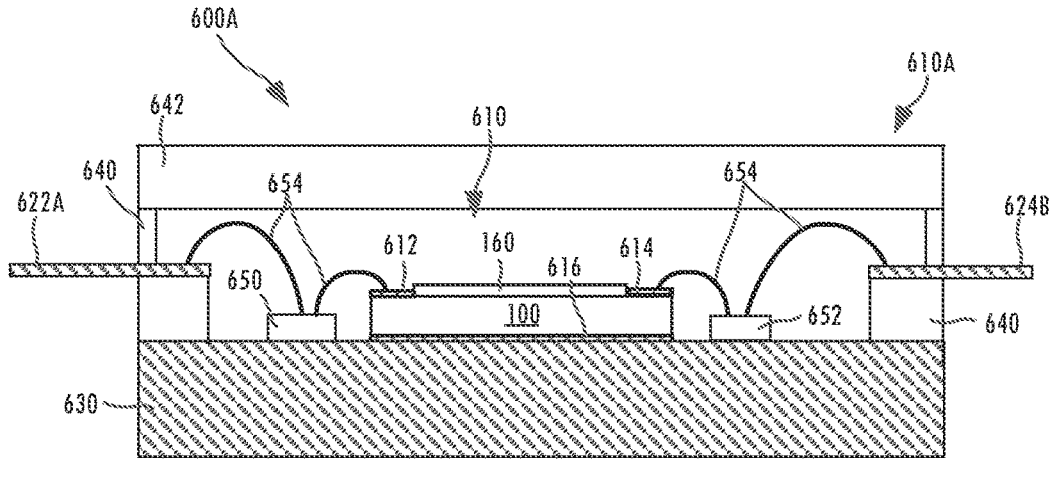
FIGS. 6A, 6B, and 6C are schematic side views illustrating several example packages including transistor devices according to embodiments of the present invention to provide packaged transistor amplifiers.
Figure 6B:
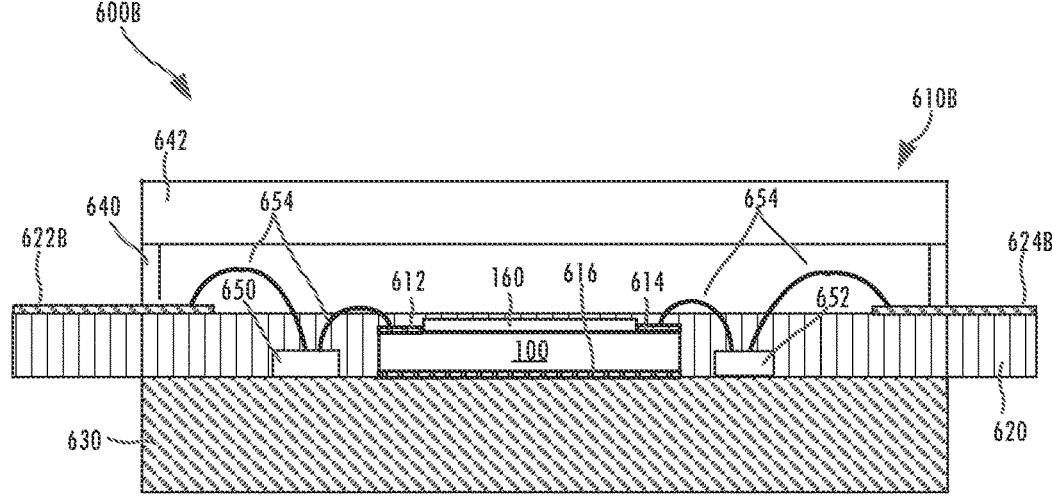
Figure 6C:
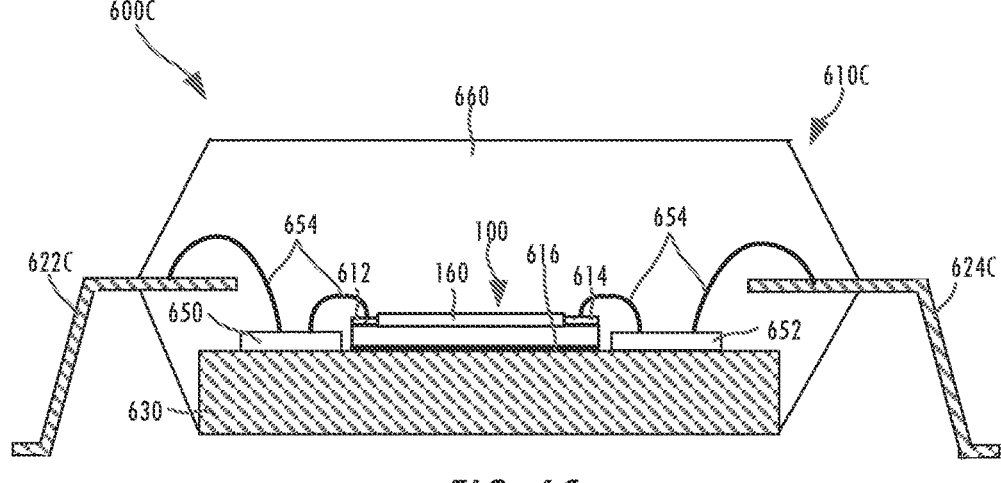

FIGS. 6A, 6B, and 6C are schematic side views illustrating several example packages including semiconductor devices according to embodiments of the present invention. The semiconductor die 100 described herein is configured as a RF Group III nitride-based HEMT to provide packaged transistor amplifiers.

In particular, FIG. 6A is a schematic side view of a package 600A for a Group III nitride-based RF transistor amplifier. As shown in FIG. 6A, packaged RF transistor amplifier 600A includes the RF transistor amplifier die 100 packaged in an open cavity package structure 610A. The package structure 610A includes metal gate leads 622A, metal drain leads 624A, a metal submount 630, sidewalls 640 and a lid 642.

The submount 630 may include materials configured to assist with the thermal management of the package 600A. For example, the submount 630 may include copper and/or molybdenum. In some embodiments, the submount 630 may be composed of multiple layers and/or contain vias/interconnects. For example, the submount 630 may be a multi-layer copper/molybdenum/copper metal flange that comprises a core molybdenum layer with copper cladding layers on either major surface thereof. In some embodiments, the submount 630 may include a metal heat sink that is part of a lead frame or metal slug. The sidewalls 640 and/or lid 642 may be formed of or include an insulating material in some embodiments. For example, the sidewalls 640 and/or lid 642 may be formed of or include ceramic materials. In some embodiments, the sidewalls 640 and/or lid 642 may be formed of, for example, $Al_2O_3$. The lid 642 may be glued to the sidewalls 640 using an epoxy glue. The sidewalls 640 may be attached to the submount 630 via, for example, brazing. The gate lead 622A and the drain lead 624A may be configured to extend through the sidewalls 640, though embodiments of the present invention are not limited thereto.

The RF transistor amplifier die 100 including the multi-layer encapsulation structures 160 described herein is mounted on the upper surface of the metal submount 630 in an air-filled cavity 610 defined by the metal submount 630, the ceramic sidewalls 640 and the ceramic lid 642. Gate and drain terminals 612 and 614 of RF transistor amplifier die 100 are on the top side of the semiconductor structure 190, while the source terminal 616 is on the bottom side of the semiconductor structure 190. The gate and drain terminals 612 and 614 may be electrically connected to the gate and drain electrodes (e.g., 112 and 114), to provide wire bond pads or otherwise allow for wire bond connections to the die 100. The source terminal 616 may be electrically connected to the source electrode (e.g., 116), and is shown as being mounted on the metal submount 630 using, for example, a conductive die attach material (not shown). The metal submount 630 may provide the electrical connection to the source terminal 616 and may also serve as a heat dissipation structure that dissipates heat that is generated in the RF transistor amplifier die 100.

Input matching circuits 650 and/or output matching circuits 652 may also be mounted within the package 600A. The matching circuits 650, 652 may include impedance matching and/or harmonic termination circuits. The impedance matching circuits may be used to match the impedance of the fundamental component of RF signals that are input to or output from the RF transistor amplifier to the impedance at the input or output of the RF transistor amplifier die 100, respectively. The harmonic termination circuits may be used to ground harmonics of the fundamental RF signal that may be present at the input or output of the RF transistor amplifier die 1000. More than one input matching circuit 650 and/or output matching circuit 652 may be provided. As schematically shown in FIG. 6A, the input and output matching circuits 650, 652 may be mounted on the metal submount 630. The gate lead 622A may be connected to the input matching circuit 650 by one or more bond wires 654, and the input matching circuit 650 may be connected to the gate terminal 612 of RF transistor amplifier die 100 by one or more additional bond wires 654. Similarly, the drain lead 624A may be connected to the output matching circuit 652 by one or more bond wires 654, and the output matching circuit 652 may be connected to the drain terminal 614 of RF transistor amplifier die 100 by one or more additional bond wires 654. The bond wires 654, which are inductive elements, may form part of the input and/or output matching circuits.

A multi-layer encapsulation structure 160 as described herein is formed on the top side of the semiconductor structure 190, and may be patterned to expose the gate and drain terminals 612, 614. The multi-layer environmental barrier 160 may include two or more sublayers of respective non-conductive materials, as described above.

FIG. 6B is a schematic side view of a packaged Group III nitride-based RF transistor amplifier 600B that includes the RF transistor amplifier die 100 packaged in a printed circuit board based package structure 610B. The packaged RF transistor amplifier 600B is very similar to the packaged RF transistor amplifier 600A of FIG. 6A, except that the gate and drain leads 622A, 624A of package structure 610A are replaced with printed circuit board based leads 622B, 624B in package structure 610B.

The package structure 610B includes a submount 630, ceramic sidewalls 640, a ceramic lid 642, each of which may be substantially identical to the like numbered elements of package structure 610A discussed above. The package structure 610B further includes a printed circuit board 620. Conductive traces on the printed circuit board 620 form a metal gate lead 622B and a metal drain lead 624B. The printed circuit board 620 may be attached to the submount 630 via, for example, a conductive glue. The printed circuit board 620 includes a central opening and the RF transistor amplifier die 100 is mounted within this opening on the submount 630. Other components of RF transistor amplifier 600B may be the same as the like-numbered components of RF transistor amplifier 600A described above.

FIG. 6C is a schematic side view of another packaged Group III nitride-based RF transistor amplifier 600C. RF transistor amplifier 600C differs from RF transistor amplifier 600A in that it includes a different package structure 610C. The package structure 610C includes a metal submount 630 (which may be similar or identical to the submount 630 of package structure 610A), as well as metal gate and drain leads 622C, 624C. RF transistor amplifier 600C also includes a plastic overmold 660 that at least partially surrounds the RF transistor amplifier die 100, the leads 622C, 624C, and the metal submount 630. Other components of RF transistor amplifier 600C may be the same as the like-numbered components of RF transistor amplifier 600A described above.

Embodiments of the present invention may provide improved performance in RF devices, such as the Group III nitride-based HEMT devices primarily described herein. However, embodiments of the present invention are not limited to RF applications and/or HEMT devices, and may be used in various other applications. For example, embodiments of the present invention may be used in applications with operating frequencies that range from less than about 6 GHz to Ku-band (6-18 GHz) and Ka-Band designs (e.g., 26-40 GHz). Particular embodiments of the present disclosure may be used in massive Multiple Input Multiple Output (mMIMO) active antennas (which may include an array of transistors implemented in transmitter/receiver pairs that utilize matrix multiplication for transmitting and receiving RF signals) as well as various cellular infrastructure (CIFR) RF power products (including, but not limited to 5 W, 10 W, 20 W, 40 W, 60 W, 80 W and different frequency bands), e.g., for 5G and base station applications, including macro (e.g., 20-80 W and different frequency bands) average power applications. Embodiments of the present disclosure may also be applied to radar (e.g., A&D discrete radar), monolithic microwave integrated circuit (MMIC)-type applications, dielectric crossover devices, and split gate devices.

The present invention is described with reference to the accompanying drawings, in which embodiments of the invention are shown. However, this invention should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout.

It will be understood that when an element such as a layer, region or substrate is referred to as being "cm" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

It will also be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower", can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

The terminology used in the description of the invention herein is for the purpose of describing particular embodiments only and is not intended to be limiting of the invention. As used in the description of the invention and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Unless otherwise defined, all terms used in disclosing embodiments of the invention, including technical and scientific terms, have the same meaning as commonly understood by one of ordinary skill in the art to which this invention belongs, and are not necessarily limited to the specific definitions known at the time of the present invention being described. Accordingly, these terms can include equivalent terms that are created after such time. It will be further understood that terms, such as those defined in commonly used dictionaries, should be interpreted as having a meaning that is consistent with their meaning in the present specification and in the context of the relevant art and will not be interpreted in an idealized or overly formal sense unless expressly so defined herein. All publications, patent applications, patents, and other references mentioned herein are incorporated by reference in their entirety.

In the drawings and specification, there have been disclosed typical embodiments of the invention, and, although specific terms have been employed, they have been used in a generic and descriptive sense only and not for purposes of limitation.

That which is claimed:

1. A semiconductor die, comprising:
a semiconductor body comprising a gate, a source contact, and a drain contact thereon;
a metal contact structure comprising first and second metal layers stacked on the semiconductor body in a first direction and electrically connected to the gate, the source contact, or the drain contact, wherein the second metal layer is directly on the first metal layer; and
an encapsulation structure comprising first and second encapsulation layers of respective non-conductive materials stacked on the metal contact structure in the first direction, and an opening extending therethrough to expose the metal contact structure at a bottom of the opening,
wherein the metal contact structure is between the encapsulation structure and the semiconductor body in the first direction, and the first metal layer is between the second metal layer and the semiconductor body in the first direction,
wherein the opening comprises a sidewall that extends through the first and second encapsulation layers and through the second metal layer to expose the first metal layer at the bottom of the opening, and a slope of the sidewall does not vary by more than about 30 degrees, and
wherein edges of the first encapsulation layer, the second encapsulation layer, and the second metal layer adjacent the opening have first, second, and third slopes, respectively, and wherein the second slope is different than the first slope.

2. The semiconductor die of claim 1, wherein the first encapsulation layer is between the second encapsulation layer and the metal contact structure, the sidewall comprises the edge of the second encapsulation layer having the second slope adjacent the opening, and the slope of the sidewall comprises the second slope.

3. The semiconductor die of claim 2, wherein the opening extends through the second metal layer to a surface of the first metal layer.

4. The semiconductor die of claim 3, wherein the sidewall further comprises the edge of the first encapsulation layer having the first slope adjacent the opening, and the slope of the sidewall further comprises the first slope.

5. The semiconductor die of claim 4, wherein the sidewall further comprises the edge of the second metal layer having the third slope adjacent the opening that is less than or equal to the first slope, and the slope of the sidewall further comprises the third slope.

6. The semiconductor die of claim 1, wherein the second slope is greater than the first slope.

7. The semiconductor die of claim 6, wherein the first, second, and third slopes are negative slopes, or the first, second, and third slopes are positive slopes.

8. The semiconductor die of claim 5, wherein the edges of the second metal layer, the first encapsulation layer, and the second encapsulation layer define respective angles of about 35 to 55 degrees relative to a normal to the surface of the first metal layer.

9. The semiconductor die of claim 8, wherein the first, second, and third slopes do not vary by more than about 10 degrees.

10. The semiconductor die of claim 6, wherein the edge of the second encapsulation layer extends towards the opening beyond the edge of the first encapsulation layer in a second direction that is perpendicular to the first direction.

11. The semiconductor die of claim 10, wherein the sidewall comprising the edge of the second encapsulation layer extends along the edge of the first encapsulation layer and on an interface between the first encapsulation layer and the second metal layer.

12. The semiconductor die of claim 11, wherein an edge of the second metal layer adjacent the opening is covered by the second encapsulation layer, and the sidewall comprising the edge of the second encapsulation layer directly contacts the surface of the first metal layer.

13. The semiconductor die of claim 1, wherein the first encapsulation layer comprises $SiO_2$, SiN, SiON, and/or $Al_2O_3$, and wherein the second encapsulation layer comprises polyimide, benzocyclobutene (BCB), borosilicate glass (BSG), polyamide, polybenzoxazole (PBO), and/or a photoresist material.

14. The semiconductor die of claim 1, wherein the sidewall defines an angle of about 40 to 50 degrees relative to a surface of the metal contact structure.

15. A semiconductor die, comprising:
a semiconductor body comprising a gate, a source contact, and a drain contact thereon;
a metal contact structure on the semiconductor body and electrically connected to the gate, the source contact, or the drain contact; and
an encapsulation structure comprising first and second encapsulation layers of respective non-conductive materials stacked on a surface of the metal contact structure in a first direction such that the metal contact structure is between the encapsulation structure and the semiconductor body in the first direction, and an opening extending therethrough to expose a portion of the surface of the metal contact structure,
wherein the first encapsulation layer is stacked between the second encapsulation layer and the metal contact structure in the first direction, wherein edges of the first and second encapsulation layers are adjacent the opening, and wherein the edge of the second encapsulation layer extends beyond the edge of the first encapsulation layer towards the opening in a second direction that is perpendicular to the first direction.

16. The semiconductor die of claim 15, wherein the opening comprises a sidewall that extends through the first and second encapsulation layers to the metal contact structure, and wherein the sidewall comprises the edge of the second encapsulation layer.

17. The semiconductor die of claim 16, wherein the metal contact structure comprises a first metal layer and a second metal layer between the first metal layer and the encapsulation structure, and wherein the opening extends through the second metal layer to a surface of the first metal layer.

18. The semiconductor die of claim 17, wherein the sidewall comprising the edge of the second encapsulation layer extends along the edge of the first encapsulation layer and on an interface between the first encapsulation layer and the second metal layer.

19. The semiconductor die of claim 17, wherein an edge of the second metal layer adjacent the opening is covered by the second encapsulation layer, and the sidewall comprising the edge of the second encapsulation layer directly contacts the surface of the first metal layer.

20. The semiconductor die of claim 16, wherein the sidewall defines an angle of about 35 to 55 degrees relative to a surface of the metal contact structure.

21. A method of fabricating a transistor device, comprising:
providing a semiconductor body;
forming a metal contact structure comprising first and second metal layers stacked on the semiconductor body in a first direction with the second metal layer directly on the first metal layer, wherein the first metal layer is between the second metal layer and the semiconductor body in the first direction;
forming an encapsulation structure comprising first and second encapsulation layers of respective non-conductive materials stacked on the metal contact structure in the first direction, wherein the metal contact structure is between the encapsulation structure and the semiconductor body in the first direction; and
forming an opening extending through the first and second encapsulation layers to expose the metal contact structure at a bottom of the opening, wherein the opening comprises a sidewall that extends through the first and second encapsulation layers and the second metal layer to expose the first metal layer at the bottom of the opening, and a slope of the sidewall does not vary by more than about 30 degrees, and
wherein edges of the first encapsulation layer, the second encapsulation layer, and the second metal layer adjacent the opening have first, second, and third slopes, respectively, and wherein the second slope is different than the first slope.

22. The method of claim 21,
wherein the first encapsulation layer is between the second encapsulation layer and the metal contact structure, the sidewall comprises the edge of the second encapsulation layer having the second slope adjacent the opening, and the slope of the sidewall comprises the second slope,
wherein the opening extends through the second metal layer to a surface of the first metal layer,
wherein the sidewall further comprises the edge of the first encapsulation layer having the first slope adjacent the opening, and the slope of the sidewall further comprises the first slope, and
wherein forming the opening comprises:
patterning the second encapsulation layer to expose a portion of the first encapsulation layer;
performing a first etching operation to remove the portion of the first encapsulation layer and expose a portion of the second metal layer; and
performing a second etching operation to remove the portion of the second metal layer and expose the surface of the first metal layer.

23. The method of claim 22, wherein, responsive to the first and second etching operations, the second slope is greater than the first slope.

24. The method of claim 23, wherein at least one of the first or second etching operations comprises a passivation gas and is configured to remove the portion of the first encapsulation layer or the second metal layer, respectively, without substantial lateral etching of the edge of the second encapsulation layer.

25. The method of claim 21, wherein the first encapsulation layer is between the second encapsulation layer and the metal contact structure, the sidewall comprises the edge of the second encapsulation layer having the second slope adjacent the opening, and the slope of the sidewall comprises the second slope,
wherein the opening extends through the second metal layer to a surface of the first metal layer,
wherein the sidewall further comprises the edge of the first encapsulation layer having the first slope adjacent the opening, and the slope of the sidewall further comprises the first slope, and wherein the edge of the second encapsulation layer extends beyond the edge of the first encapsulation layer in a second direction that is perpendicular to the first direction.

26. The method of claim 25, wherein the sidewall comprising the edge of the second encapsulation layer extends along the edge of the first encapsulation layer and on an interface between the first encapsulation layer and the second metal layer.

27. The method of claim 26, wherein forming the opening comprises:

performing a first etching operation to remove a portion of the first encapsulation layer and expose a portion of the second metal layer;

performing a second etching operation to remove the portion of the second metal layer and expose the surface of the first metal layer;

forming the second encapsulation layer on the first encapsulation layer and on the surface of the first metal layer; and patterning the second encapsulation layer to expose the surface of the first metal layer.

28. The method of claim 27, wherein the second encapsulation layer comprises a photosensitive material, and wherein patterning the second encapsulation layer comprises photolithographically patterning the second encapsulation layer to expose the surface of the first metal layer.

29. A semiconductor die, comprising:

a semiconductor body comprising a gate, a source contact, and a drain contact thereon;

a metal contact structure on the semiconductor body and electrically connected to the gate, the source contact, or the drain contact; and an encapsulation structure comprising first and second encapsulation layers of respective non-conductive materials stacked on the metal contact structure in a first direction, and an opening extending therethrough to expose the metal contact structure at a bottom of the opening, wherein the metal contact structure is between the encapsulation structure and the semiconductor body in the first direction, and wherein the second encapsulation layer is directly on the first encapsulation layer, wherein the opening comprises a sidewall having a substantially continuous slope that extends through the first and second encapsulation layers to the metal contact structure, and wherein the sidewall defines an angle of about 35 to 55 degrees relative to a surface of the metal contact structure and comprises edges of the first and second encapsulation layers having first and second slopes that differ.

30. The semiconductor die of claim 29, wherein the first encapsulation layer is stacked in the first direction between the second encapsulation layer and the metal contact structure, and the second slope is greater than the first slope.

31. The semiconductor die of claim 30, wherein the edge of the second encapsulation layer extends beyond the edge of the first encapsulation layer in a second direction that is perpendicular to the first direction, and wherein the substantially continuous slope does not vary by more than about 30 degrees.

32. The semiconductor die of claim 29, wherein the first encapsulation layer comprises a first material, the second contact layer comprises a second material that is different from the first material, and the second slope transitions to the first slope at an interface between the second encapsulation layer and the first encapsulation layer.

* * * * *